US012608032B2

(12) United States Patent
Wu

(10) Patent No.: US 12,608,032 B2
(45) Date of Patent: Apr. 21, 2026

(54) COMPLEMENTARY METAL-OXIDE-SEMICONDUCTOR (CMOS) VOLTAGE REFERENCE GENERATOR

(71) Applicant: MACRONIX INTERNATIONAL CO., LTD., Hsinchu (TW)

(72) Inventor: Hsien-Hung Wu, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 224 days.

(21) Appl. No.: 18/659,321

(22) Filed: May 9, 2024

(65) Prior Publication Data

US 2025/0348103 A1     Nov. 13, 2025

(51) Int. Cl.
*G05F 3/26*          (2006.01)
*G11C 16/04*         (2006.01)

(52) U.S. Cl.
CPC .......... *G05F 3/262* (2013.01); *G11C 16/0483* (2013.01)

(58) Field of Classification Search
CPC .......... G05F 3/262; G05F 3/222; G05F 3/225; G05F 3/242; G05F 3/245; G11C 16/0483
See application file for complete search history.

(56) References Cited

U.S. PATENT DOCUMENTS

| | | | |
|---|---|---|---|
| 11,675,384 B2 | 6/2023 | Wu | |
| 2023/0205246 A1 | 6/2023 | Roh et al. | |
| 2024/0094758 A1* | 3/2024 | Yoshikawa | .......... G05F 3/262 |

FOREIGN PATENT DOCUMENTS

| | | | | |
|---|---|---|---|---|
| CN | 106020318 A | 10/2016 | | |
| CN | 106774594 A | 5/2017 | | |
| CN | 114690829 A | * 7/2022 | .......... | G05F 1/565 |
| CN | 115220517 A | 10/2022 | | |
| JP | 2008084342 A | 4/2008 | | |
| JP | 2012174041 A | 9/2012 | | |
| TW | 201331738 A | 8/2013 | | |
| TW | 202236044 A | 9/2022 | | |
| TW | 202316224 A | 4/2023 | | |

* cited by examiner

*Primary Examiner* — Crystal L Hammond
*Assistant Examiner* — Jonathan Walter Soileau
(74) *Attorney, Agent, or Firm* — Andrew L. Dunlap; Haynes Beffel & Wolfeld LLP

(57)          ABSTRACT

A voltage generation circuit for high performance and high capacity three-dimensional (3D) NAND memory that receives an input control current and outputs a VREF is provided. The voltage generation circuit includes a first circuit including first and second transistors connected in series between a first node receiving the input control current and a supply node, a second circuit including first and second resistors connected in series between the first node and the supply node, wherein the input control current is divided between the first and second circuits, reference node outputs VREF and is connected to the first transistor, a second node located between the first resistor and the second resistor and in electrical communication with the second transistor, and a current supply circuit connected to the second node and providing a compensation current that influences VREF to account for changes in operating temperatures.

20 Claims, 22 Drawing Sheets

400

100
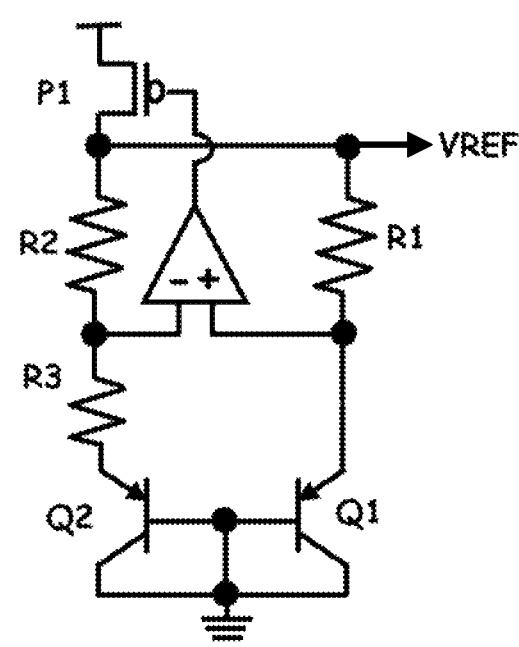
FIG. 1 – Prior Art
200
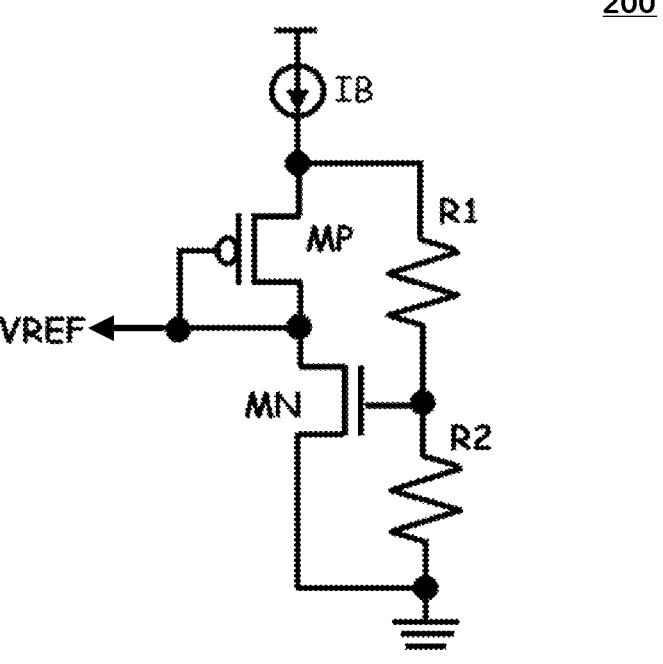
FIG. 2 – Prior Art

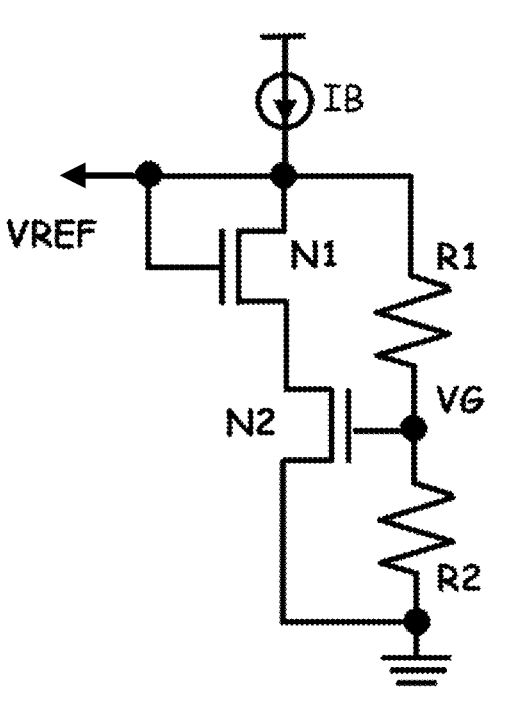
FIG. 3 – Prior Art
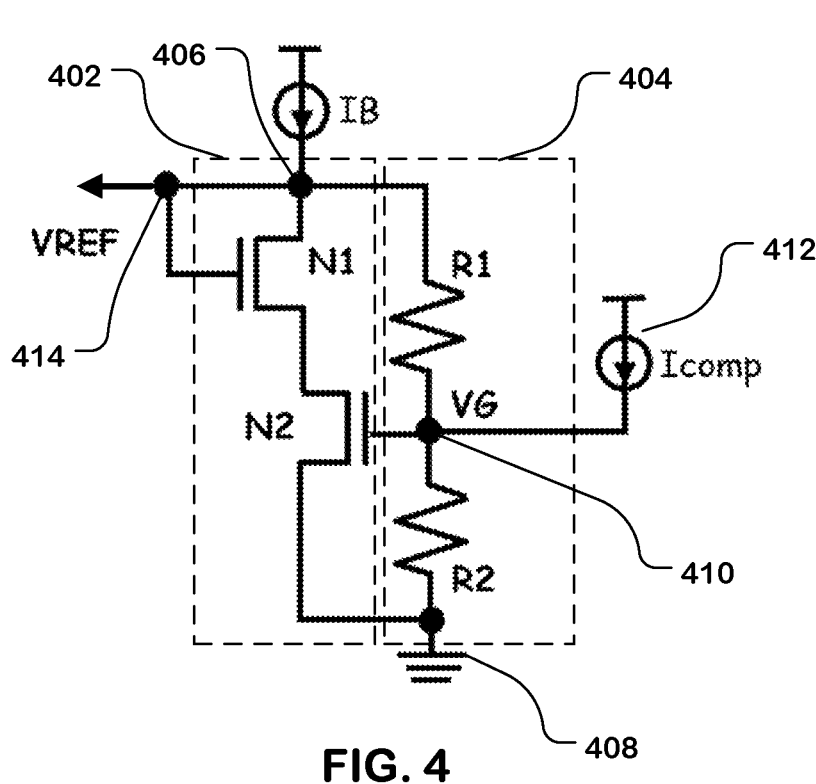
FIG. 4

500

900

1400

VREF (V)

SS: R2A/R2=0.87

FS: R1B/R1=0.98

TT: R1B/R1=1

SF: R1B/R1=0.96

FF: R1B/R1=0.66

Voltage (V)

VREF

VG

VDS2+Vth2

Current (A)

Icomp

2600

COMPLEMENTARY METAL-OXIDE-SEMICONDUCTOR (CMOS) VOLTAGE REFERENCE GENERATOR

BACKGROUND

Field

The technology disclosed relates to a voltage generator. More specifically, the technology disclosed relates to a complementary metal-oxide-semiconductor (CMOS) voltage reference generator that generates a reference voltage (VREF) that does not fluctuate as a result of changing operating temperatures.

Description of Related Art

As three-dimensional (3D) NAND memory capacity increases, more memory data is processed as higher speeds. This increase in memory capacity with the demand of higher speed performance can increase power consumption of the 3D NAND memory. In order to maintain (i.e., prevent an increase in) power consumption, it is desirable to operate using a low reference (and stable) voltage (VREF) or power supply voltage that is not influenced by operating temperatures. The voltage bandgap of silicon is approximately 1.2V and it is desirable to provide a VREF around 1.2V that does not fluctuate based on operating temperatures. Traditional reference voltage (VREF) generation circuits can suffer a problem of fluctuating based on operating temperatures, having insufficient voltage headroom, and operating in a saturation region, as opposed to a linear region.

Therefore, a need arises for a VREF generation circuit that does not fluctuate based on operating temperatures, that has sufficient voltage headroom and that does not operate in a saturation region.

SUMMARY

According to an aspect of the technology disclose, a voltage generation circuit that receives an input control current and outputs a reference voltage (VREF) is provided. The voltage generation circuit can include a first circuit including a first transistor and a second transistor connected in series between a first node receiving the input control current and a supply node, a second circuit including a first resistor and a second resistor connected in series between the first node and the supply node, wherein the input control current is divided between the first circuit and the second circuit, a reference node that outputs the reference voltage (VREF) and that is connected to the first transistor of the first circuit, a second node located between the first resistor and the second resistor and in electrical communication with the second transistor, and a current supply circuit connected to the second node and providing a compensation current that influences the reference voltage (VREF) to account for changes in operating temperatures of the voltage generation circuit.

According to another aspect of the technology disclosed, the first resistor and the second resistor can be both tunable.

In another aspect of the technology disclosed, the second node can be connected to a gate of the second transistor.

In a further aspect of the technology disclosed, the first transistor and the second transistor can be NMOS transistors.

According to an aspect of the technology disclosed, the reference voltage (VREF) is not influenced by operating temperature variations as a result of the compensation current having a decreasing slope from a lower operating temperature to a higher operating temperature, resulting from a negative operating temperature coefficient.

In a further aspect of the technology disclosed, the operating temperatures can range from 25 C to 85 C.

In an aspect of the technology disclosed, the input control current can be received from a power supply circuit at the first node, where the power supply circuit can include a first power supply transistor that is in series with the first transistor and the second transistor, that receives a power supply and that provides the input control current to the first node, and a current generator that controls a current that is mirrored to the first power supply transistor.

In another aspect of the technology disclosed the current generator can include a first branch (i) including a first current generator transistor in series with a second current generator transistor and (ii) located between a power supply and the supply node, and a second branch (i) including a third current generator transistor in series with a fourth current generator transistor and a first current generator resistor and (ii) located between the power supply and the supply node, wherein the first branch is parallel to the second branch.

In a further aspect of the technology disclosed, the first current generator transistor and the third current generator transistor can be PMOS transistors and the second current generator transistor and the fourth current generator transistor can be NMOS transistors.

According to an aspect of the technology disclosed a ratio of a resistance of the first resistor to a resistance of the second resistor can be less than 1.

In another aspect of the technology disclosed the ratio can be approximately 0.2.

In a further aspect of the technology disclosed a voltage generation circuit that receives an input control current and outputs a reference voltage (VREF) is provided. The voltage generation circuit can include a first circuit including a first transistor and a second transistor connected in series between a first node receiving the input control current and a supply node, a second circuit including a first resistor, a second resistor and a third resistor connected in series between the first node and the supply node, wherein the input control current is divided between the first circuit and the second circuit, a reference node that outputs the reference voltage (VREF) and that is connected to the first transistor of the first circuit, a second node located between the second resistor and the third resistor and in electrical communication with the second transistor, and a current supply circuit connected to the second node and providing a compensation current that influences the reference voltage (VREF) to account for changes in operating temperatures of the voltage generation circuit.

According to an aspect of the technology disclosed a ratio of (i) a resistance of the second resistor to (ii) a combined resistance of the second resistor and the third resistor can be tunable to account for manufacturing variations.

In a further aspect of aspect of the technology disclosed the ratio can have a maximum value of 1.

In an aspect of the technology disclosed the current supply circuit can include positive biasing current circuitry that provides a current having a positive temperature coefficient from a lower operating temperature to a higher operating temperature, and negative biasing current circuitry that provides a current having a negative temperature coefficient from the lower operating temperature to the higher operating temperature, wherein the compensation current is a combination of the current having the positive temperature coefficient and the negative temperature coefficient.

According to an aspect of the technology disclosed the combination of the current having the positive temperature coefficient and the current having the negative temperature coefficient, at the higher operating temperature, results in the compensation current having an approximate value of 0 A.

In a further aspect of the technology disclosed the first transistor and the second transistor can be NMOS transistors.

In an aspect of the technology disclosed a voltage generation circuit that receives an input control current and outputs a reference voltage (VREF) is provided. The voltage generation circuit can include a first circuit including a first transistor and a second transistor connected in series between a first node receiving the input control current and a supply node, a second circuit including a first resistor, a second resistor, a third resistor and a fourth resistor connected in series between the first node and the supply node, wherein the input control current is divided between the first circuit and the second circuit, a reference node that outputs the reference voltage (VREF) and that is connected to the first transistor of the first circuit, a second node located between the first resistor and the second resistor and in electrical communication with the second transistor, and a current supply circuit connected to the second node and providing a compensation current that influences the reference voltage (VREF) to account for changes in operating temperatures of the voltage generation circuit.

In another aspect of the technology disclosed a first ratio of (i) a resistance of the first resistor to (ii) a combined resistance of the first resistor and the second resistor is tunable to account for manufacturing variations, and a second ratio of (i) a resistance of the third resistor to (ii) a combined resistance of the third resistor and the fourth resistor is tunable to account for manufacturing variations.

In a further aspect of the technology disclosed the second ratio can be less than 1 and the first ratio can be less than the second ratio.

The above descried aspects of the technology disclosed can be implemented by methods of providing a VREF as well as a non-transitory computer-readable recoding medium having instructions recorded thereon, such that when executed by a processor the processor performs the operations of the voltage generation circuit and of the methods of providing the VREF.

Other aspects and advantages of the present invention can be seen on review of the drawings, the detailed description and the claims, which follow.

BRIEF DESCRIPTION OF THE DRAWINGS

FIG. 1 illustrates a traditional reference voltage (VREF) generation circuit 100 that has insufficient voltage headroom (e.g., difference between input voltage and output voltage), which is undesirable when providing a VREF.

FIG. 2 illustrates a traditional VREF generation circuit 200 that operates in a saturation region (e.g., as a closed switch), which is undesirable when providing a VREF.

FIG. 3 illustrates a traditional VREF generation circuit 300 that provides a VREF that changes according to operating temperature, which is undesirable when providing a VREF.

FIG. 4 illustrates a VREF circuit 400 that removes the linear change of VREF with respect to operating temperatures, which results from the VREF circuits of FIGS. 2 and 3.

DETAILED DESCRIPTION

Figure 5:
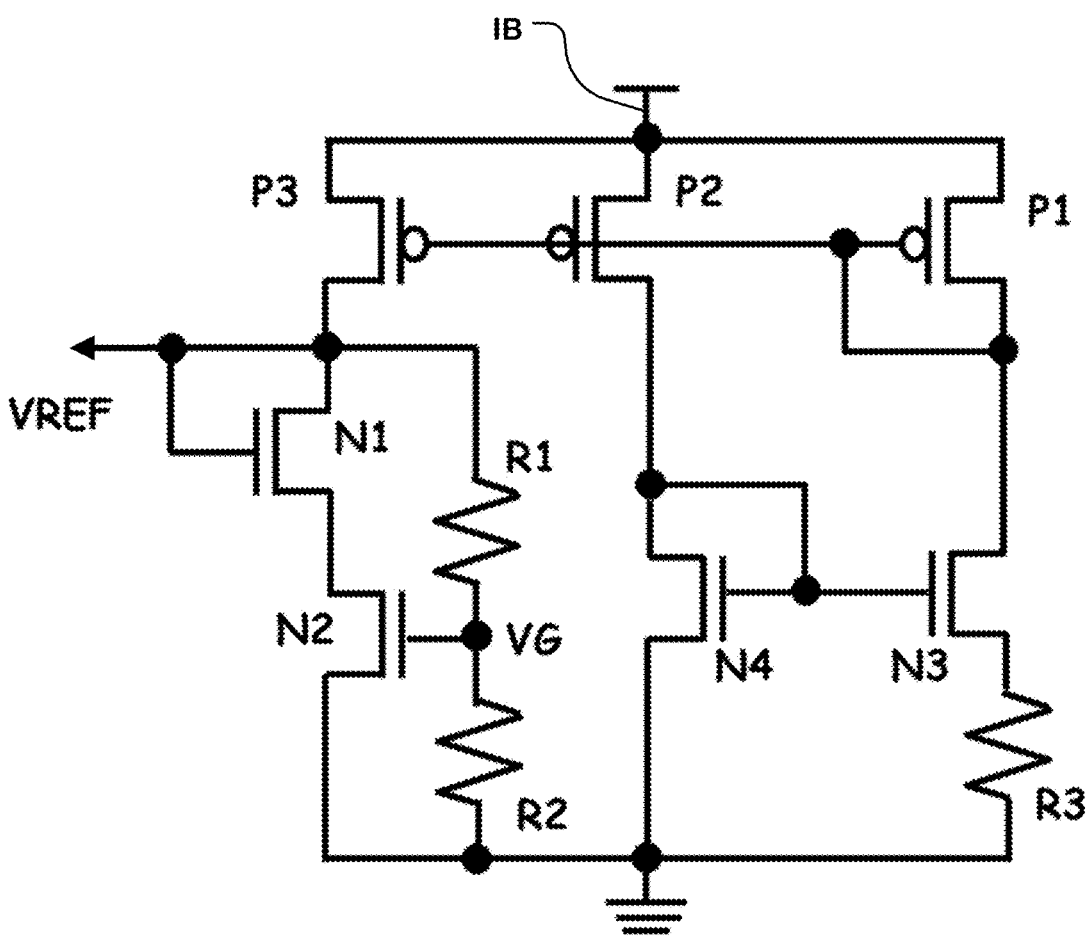
FIG. 5 illustrates a VREF circuit 500, which is based on the traditional VREF circuit 300 of FIG. 3, with additional power supply circuitry that provides input control current IB.

A detailed description of embodiments of the present invention is provided with reference to the FIGS. 1-26.

FIG. 1 illustrates a traditional reference voltage (VREF) generation circuit 100 that has insufficient voltage headroom (e.g., difference between input voltage and output voltage), which is undesirable when providing a VREF.

Specifically, the VREF generation circuit 100 includes bipolar junction transistors (BJT) Q1 and Q2 in a parallel configuration, with resistors R2 and R3 and PMOS transistor P1 in series with BJT transistor Q2 and with resistor R1 in series with BJT transistor Q1.

FIG. 2 illustrates a traditional VREF generation circuit 200 that can operate in a saturation region (e.g., as a closed switch, no gain) and is temperature dependent, which is undesirable when providing a VREF.

For example, transistor MP (PMOS transistor) and MN (NMOS transistor) of the VREF generation circuit 200 operate in a saturation region (e.g., a difference of the gate to source voltage (Vgs) of MP and MN results in saturation as opposed to operation in a linear region of the transistors).

The operational characteristics of the VREF generation circuit 200 are described in the equations below.

$$V_{GSn} = V_{thn} + \sqrt{2I_D/(\mu_n C_{ox} W_n/L_n)}$$

$$V_{GSp} = V_{thp} + \sqrt{2I_D/(\mu_p C_{ox} W_p/L_p)}$$

$$V_{thn} = V_{thn0} - \beta_{vthn} (T - T_0), \ \mu_n = \mu_{n0} (T/T_0)^{-\beta_{\mu n}}$$

$$V_{thp} = V_{thp0} - \beta_{vthp} (T - T_0), \ \mu_p = \mu_{p0}(T/T_0)^{-\beta_{\mu p}}$$

where $T_0$ is the reference temperature $$V_{REF} = V_{GSn} (1 + R_1/R_2) - |V_{GSp}|$$

$$\partial V_{REF}/\partial T = (\partial V_{GSn}/\partial T) (1 + R_1/R_2) - |\partial V_{GSp}/\partial T|$$

for $\partial V_{REF}/\partial T = 0$ at $T = T_r$ requires $R_1/R_2 = \beta_{vthp}/\beta_{vthn} - 1$     (1a)

$$(W_p/L_p)/(W_n/L_n) = \frac{(\mu_{n0}/\mu_{p0}) (T_r/T_o)^{\beta_{\mu n} - \beta_{\mu p}}}{(\beta_{vthp}/\beta_{vthn})^2 (0.5 + \beta_{\mu n}/2\beta_{\mu p})^2} \qquad (1b)$$

For the MN transistor, $V_{GSn}$ is the gate to source voltage, $Vth_n$ is the threshold voltage, $I_D$ is the drain voltage, $\mu_n$ is the charge-carrier effective mobility characteristic, $C_{ox}$ is the oxide capacitance, $\beta_{\mu n}$ or $(\beta_{vthn})$ is the gain, $W_n$ is the channel width of the MN transistor, $L_n$ is the channel length of the MN transistor, T is the environmental temperature (e.g., the temperature of the surrounding environment), $T_0$ is the reference temperature and $T_r$ is the desired temperature for VREF with a zero temperature coefficient. Similar variables are provided for the MP transistor in the equations above. The temperature dependence of VREF in FIG. 2 can be set to zero by the resistor (resistance) ratio in (1a) and aspect ratios for the MP and MN transistors in (1b). The resistor and aspect ratios depend on the temperature coefficients of the threshold voltages and carrier motilities for the MP and MN transistors, and these temperature coefficients can only be extracted from dedicated MP and MN transistor test structures, not from VREF measurement. If, at manufacture, $\beta_{\mu p}$ or $\beta_{\mu n}$ or $(\beta_{vthp}/\beta_{vthn})$ deviates due to a local mismatch between the MN and MP transistors, it would inevitably influence the temperature dependence of VREF. FIG. 3 illustrates a traditional VREF generation circuit 300 that provides a VREF that changes according to operating temperature, which is undesirable when providing a VREF.

Specifically, FIG. 3 illustrates a VREF circuit that includes NMOS-type transistors. FIG. 3 includes NMOS transistors N1 and N2 in series along with resistors R1 and R2 in series. The transistors N1 and N2 are parallel to the resistors R1 and R2. Input control current IB is divided between the branch that includes transistors N1 and N2 and the branch that includes resistors R1 and R2. VG represents the gate voltage of transistor N2 and is at a node located between the in-series resistors R1 and R2. The branch that includes transistors N1 and N2 and the branch that includes resistors R1 and R2 are located between a source of the input control current IB and a supply node (e.g., ground). The operating characteristics of the traditional VREF generation circuit 300 are provided in the equations listed below.

$N_2$ in linear region and $K_2 = \mu_n C_{OX} W_{N2}/L_{N2}$   $R_{DS2} = V_{DS2}/I_{N2}$ $$I_{N2} = K_2\left[(V_G - V_{th2}) \cdot V_{DS2} - V_{DS2}^2/2\right] \approx K_2[(V_G - V_{th2}) \cdot V_{DS2}]$$

$$V_G \approx V_{th2} + I_{N2}/(K_2 \cdot V_{DS2}) \qquad (2a)$$

$$\approx V_{th2} + 1/(K_2 \cdot R_{DS2})$$

$$\approx V_{th2} + (K_2 \cdot R_{DS2})^{-1}$$

$$\partial V_G/\partial T = \partial V_{th2}/\partial T - \left(K_2 \cdot \partial R_{DS2}/\partial T + \partial K_2/\partial T \cdot R_{DS2}\right) \qquad (2b)$$

According to Kirchoff's Voltage Law, VREF=VG(1+R1/R2). If transistor N1 operates in a saturation region, if transistor N2 operates in a linear region and if the drain voltage of N2, or VDS2 (i.e., the drain to source voltage of transistor N2), satisfies VDS2+Vth2<VG, then VG is expressed in equation (2a). Further, ∂VG/∂T in (2b), or the temperature coefficient (TC) of VG, could be expressed as a linear combination of ∂Vth2/∂T, ∂RDS2/∂T and ∂K2/∂T. The same applies to VREF, such that VREF is temperature dependent based on temperature coefficients TC. This linear change in VREF based on temperature is undesirable.

FIG. 4 illustrates a VREF circuit 400 (e.g., a voltage generation circuit) that removes the linear change of VREF with respect to operating temperatures, which results from the VREF circuits 200 and 300 of FIGS. 2 and 3.

The VREF circuit 400 of FIG. 4 is similar to the VREF circuit 300 of FIG. 3 and includes NMOS transistors N1 and N2 in series between a first node 406 receiving an input control current (IB) and a supply node, such as ground, and further includes resistors R1 and R2. Resistors R1 and R2 can be tunable resistors. Further, all other resistors described herein with respect to the technology disclosed can be tunable. Additionally, the VREF circuit 400 includes a current supply, such as compensation current Icomp that is provided to the VG node. The compensated VREF (to account for temperature variations) and resulting temperature coefficients TC are expressed in equations (3a) and (3b). As a result, the temperature coefficient TC resulting from compensation current Icomp could be designed to achieve a VREF that has a zero-temperature coefficient TC. The equations of IN2 and 1/(K2*RDS2), as discussed above with respect to FIG. 3, are still applicable to FIG. 4.

$$I_{R1} = I_{R2} - I_{comp}$$

$$V_G = R_2 \cdot I_{R2}, \text{ or } I_{R2} = V_G/R_2$$

$$V_{REF} = V_G + V_{R1} = V_G + R_1 \cdot I_{R1} \qquad (3a)$$

$$= V_G + R_1 \cdot (I_{R2} - I_{comp})$$

$$= V_G + R_1 \cdot (V_G/R_2 - I_{comp})$$

$$= (1 + R_1/R_2) \cdot V_G - R_1 \cdot I_{comp}$$

$$\partial V_{REF}/\partial T = (1 + R_1/R_2) \cdot \partial V_G/\partial T - (\partial R_1/\partial T \cdot I_{comp} + R_1 \cdot \partial I_{comp}/\partial T) \quad (3b)$$

The combination of transistors N1 and N2 can be referred to as a first circuit 402, the combination of (tunable) resistors R1 and R2 can be referred to as a second circuit 404. As illustrated, the first circuit 402 includes transistors N1 and N2 connected in series between a first node 406 that receives the input control current (IB) and the supply node (e.g., ground) 408. Transistor N1 can be referred to as a first transistor and transistor N2 can be referred to as a second transistor. The second circuit 404 includes tunable resistors R1 and R2 that are connected in series between the first node 406 that receives the input control current (IB) and the supply node 408. Resistor R1 can be referred to as a first resistor and resistor R2 can be referred to as a second resistor.

The first circuit 402 and second circuit 404 can be arranged in parallel with respect to one another. Further, the VREF circuit 400 includes a second node (VG) 410 that is located between the first resistor R1 and the second resistor R2 and that is in electrical communication with the transistor N2 (e.g., a gate of resistor N2). Additionally, as illustrated, the input control current (IB) is divided between the first circuit 402 and the second circuit 404 (at the first node 406) and the VREF is output from the first circuit 402, as provided from the first node 406 that is connected to transistor N1. The gate of transistor N1 can also be connected to VREF. VREF is output at a reference node 414. A circuit (e.g., a current supply circuit) 412 can provide the compensation current Icomp (e.g., a temperature compensation current) that varies across a range of operating temperatures of the VREF circuit 400, as influenced by internal and external conditions, so as to reduce or eliminate fluctuations of VREF as the operating temperature changes. The performance of the VREF circuit 400 is discussed in more detail below with reference to various graphs.

FIG. 5 illustrates a VREF circuit 500, which is based on the traditional VREF circuit 300 of FIG. 3, with additional power supply circuitry that provides input control current IB.

The power supply circuitry includes PMOS transistors P1, P2, and P3 arranged in parallel with one another. Additionally, NMOS transistor N4 is in series with transistor P2 and NMOS transistor N3 and resistor R3 are in series with transistor P1. The branch including transistors P2 and N4 is located between a power supply and a supply node and the branch including transistors P1 and N3 and resistor R3 is also located between the power supply and the supply node.

To satisfy VDS2+Vth2<VG (for transistor N2), the circuit of FIG. 5 can implement transistor N1 to have a 600 mV−Vth, implement transistor N2 to have a 200 mV−Vth, and implement transistor P3 to have a 800 mV−Vth to provide input control current IB. Input control current IB is mirrored from a current generator including PMOS transistors P1, P2, NMOS transistors N3, N4 and resistor R3. The resistor R1/R2 (resistance) ratio can be set to 0.2. The resistor R1/R2 ratio can be 1 or less.

Once current is flowing through R1 and R2, the initial voltage on VG can enable (turn on) transistor N2, then transistor N1 can begin to conduct current from drain to source. As a result, current will be redistributed from resistors R1 and R2 to transistors N1 and N2. Then a new VG can be achieved and current redistribution continues until a stable condition is developed. At this point VG is higher than the voltage threshold Vth of transistor N2 and the output VREF is higher than the voltage threshold Vth of transistor N1. In other words, at this point, VREF=VG(1+R1/R2)>Vth1=600 mV or VG>600 mV/(1+R1/R2)=600 mV/1.2=500 mV. Accordingly, VG is higher than 500 mV or 2.5-times higher than the voltage threshold Vth of transistor N2. Regardless, the VREF as output from the VREF circuit 500 varies according to operating conditions, for the same reasons as the VREF output from the VREF circuit 300.

Figures 6A, 6B:
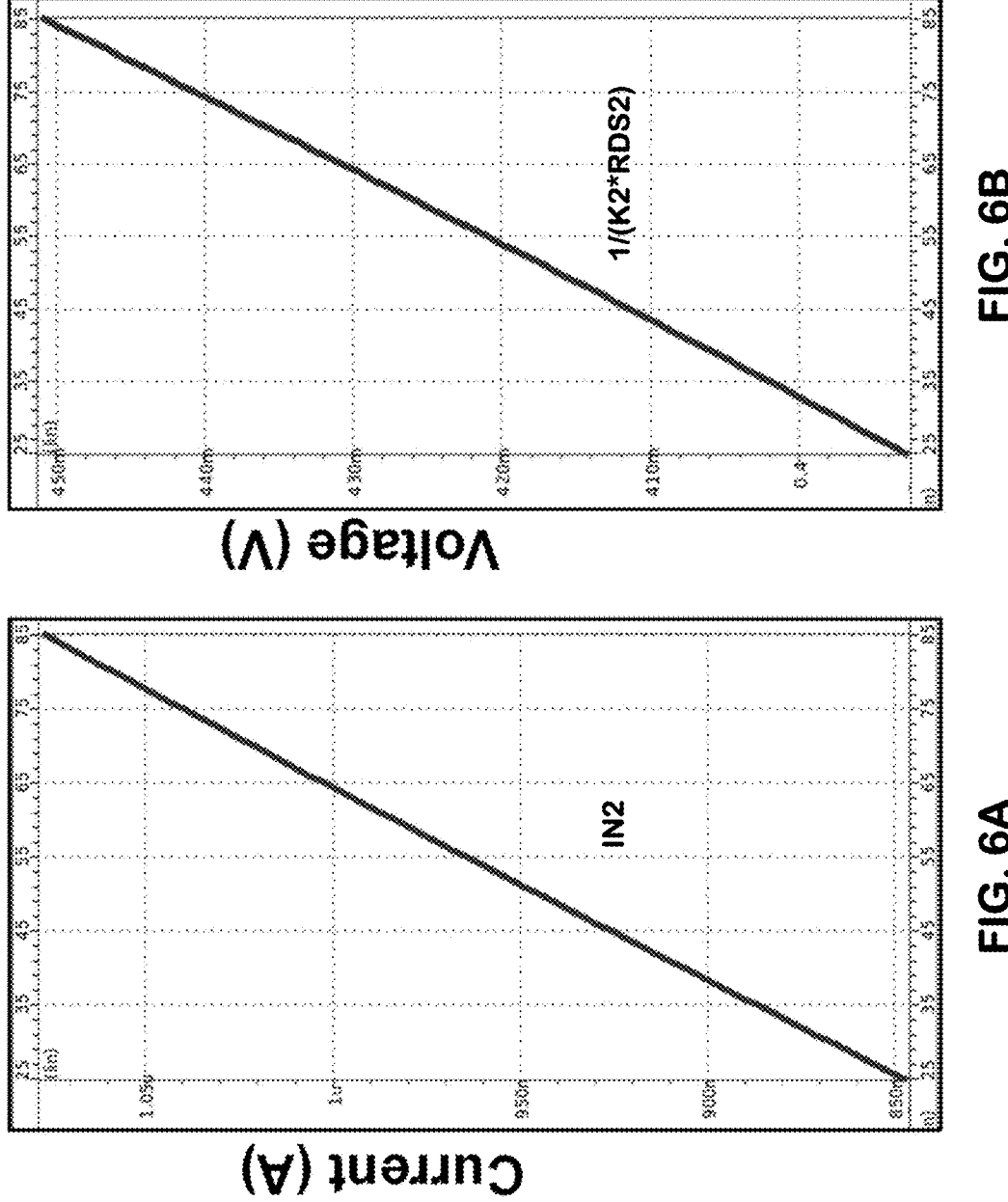
FIG. 6A is a graph that illustrates the IN2 component discussed with reference to FIG. 3, wherein the graph depicts current versus temperature in C for IN2.
FIG. 6B is a graph that illustrates the 1/(K2*RDS2) component discussed with reference to FIG. 3, wherein the graph depicts voltage versus temperature in C for 1/(K2*RDS2).

FIG. 6A is a graph that illustrates the IN2 component discussed above with reference to FIG. 3, wherein the graph depicts current versus temperature in C for IN2. As illustrated, the value of the current IN2 that passes through transistor N2 increases as temperature increases (e.g., has a positive temperature coefficient TC, represented by a positive (increasing) slope).

FIG. 6B is a graph that illustrates the 1/(K2*RDS2) component discussed above with reference to FIG. 3, wherein the graph depicts voltage versus temperature in C for 1/(K2*RDS2). As illustrated, the voltage value of 1/(K2*RDS2) increases as the temperature increases (e.g., has a positive temperature coefficient TC).

Figure 7:
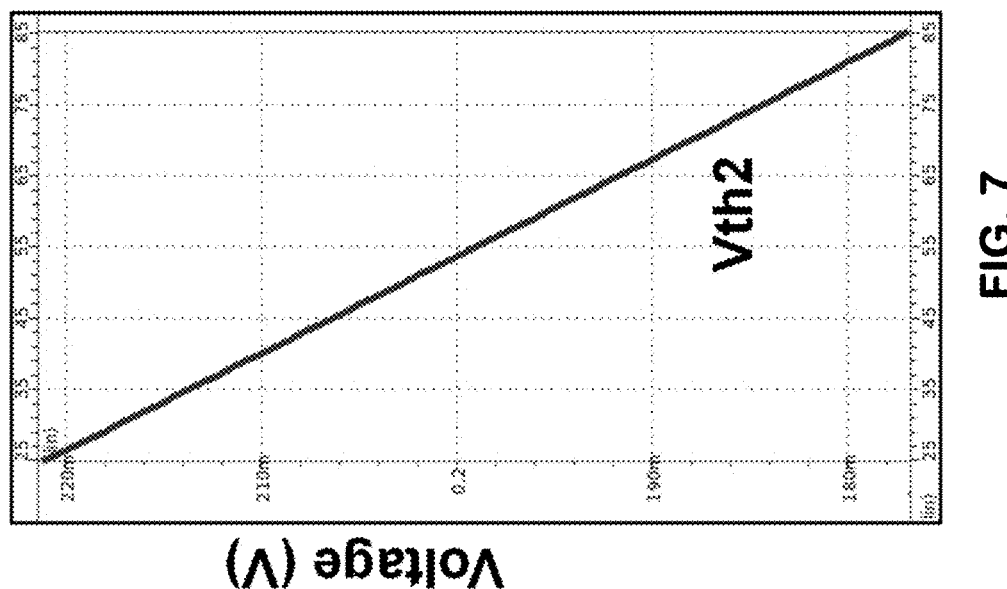
FIG. 7 is a graph that illustrates the threshold voltage Vth2 component of transistor N2 discussed with reference to FIG. 3, wherein the graph depicts voltage versus temperature in C for Vth2.

FIG. 7 is a graph that illustrates the threshold voltage Vth2 component of transistor N2 discussed above with reference to FIG. 3, wherein the graph depicts voltage versus temperature in C for Vth2. As illustrated, the voltage value of Vth2 decreases as the temperature increases (e.g., has a negative temperature coefficient TC, represented by a negative (decreasing) slope). Specifically, the negative temperature coefficient TC is approximately of $-3.32E^{-3}$/degree (C). Referring back to equation (2a) discussed above with reference to FIG. 3, the linear combination of 1/(K2*RDS2) and Vth2 renders VG with a positive temperature coefficient TC of $3.75E^{-4}$/degree (C).

Figure 8:
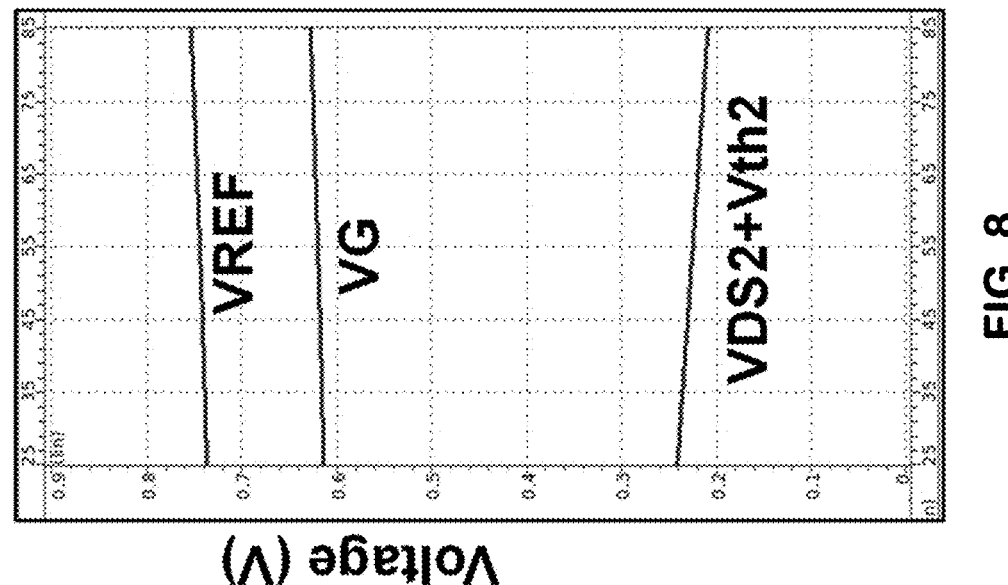
FIG. 8 is a graph that illustrates the voltages VG, VREF and VDS2+Vth2 for temperature ranges from 25 C to 85 C.

FIG. 8 is a graph that illustrates the voltages VG, VREF and VDS2+Vth2 for temperature ranges from 25 C to 85 C, where VREF is 754 mV at 85 C and 737 mv at 25 C, such that there is a 17 mv difference between 25 C and 85 C. Further, the graph of FIG. 8 illustrates that VG increases between 25 C and 85 C and VDS2+Vth2 decreases between 25 C and 85 C. This positive temperature coefficient TC of VREF is undesirable.

Figure 9:
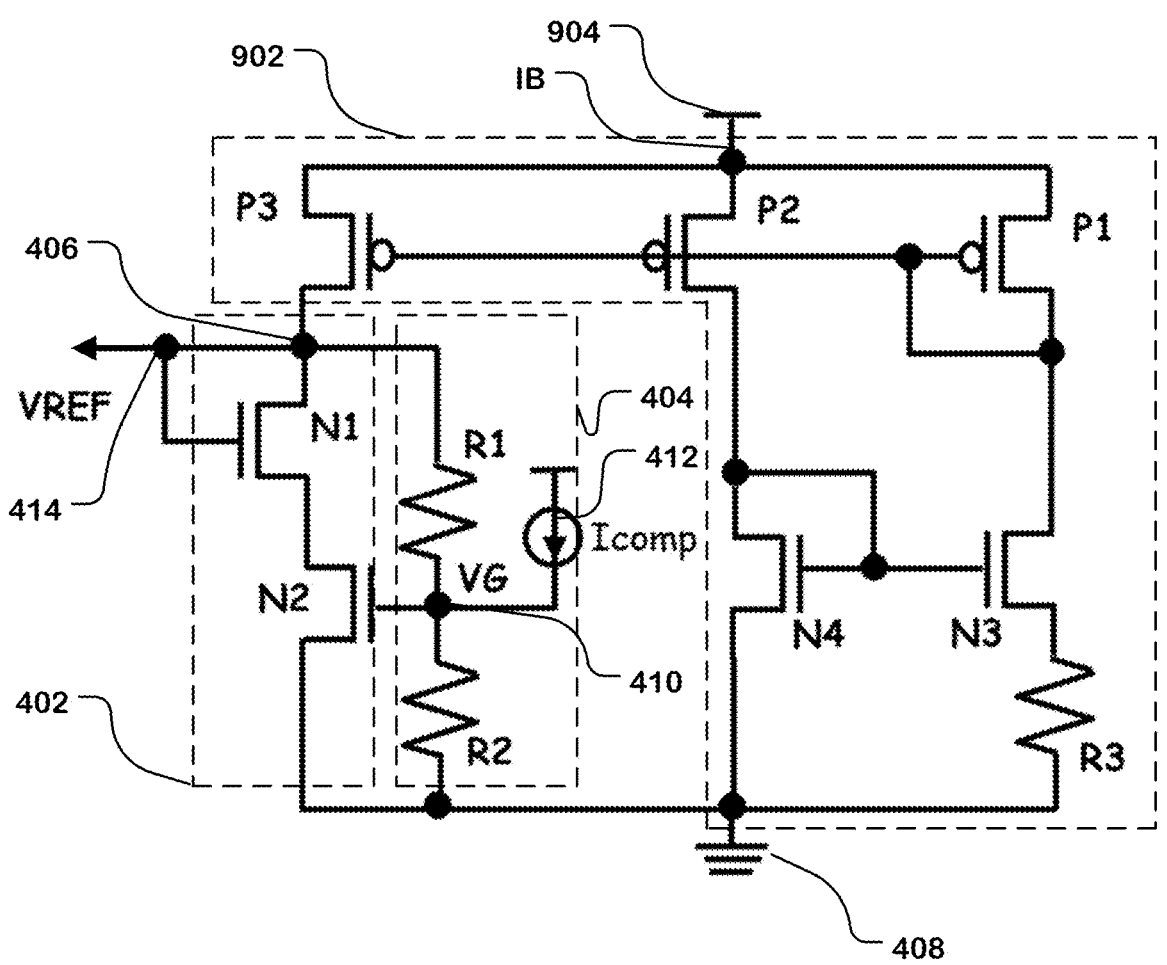
FIG. 9 illustrates a VREF circuit 900, which includes the VREF circuit 400 of FIG. 4 that eliminates the linear change of VREF with respect to temperature, with additional power supply circuitry that provides input control current IB.

FIG. 9 illustrates a VREF circuit 900 (e.g., a voltage generation circuit), which includes the VREF circuit 400 of FIG. 4 that eliminates the linear change of VREF with respect to temperature, with additional power supply circuitry that provides input control current IB.

Descriptions of components of VREF circuit 900 that are the same as VREF circuit 400 are omitted. Similar to FIG. 5, additional power supply circuitry 902 of FIG. 9 is added to the VREF circuit 400 of FIG. 4. Similar to FIG. 5, the power supply circuitry 902 of FIG. 9 includes transistors P1, P2, P3, N3, N4 and resistor R3.

Transistor P3 can be referred to as a first power supply transistor, that is in series with the first transistor (transistor N1) and the second transistor (transistor N2). Transistors P1, P2, N3, N4 and resistor R3 can be referred as a current generator that provides/controls a current that is mirrored to the first power supply transistor (transistor P3). For example, the current generator can include a first branch including transistor P2 (e.g., a first current generator transistor) in series with transistor N4 (e.g., a second current generator transistor), wherein the first branch is located between a power supply 904 and the supply node 408. The current generator can include a second branch including transistor P1 (e.g., a third current generator transistor) in series with transistor N3 (e.g., a fourth current generator transistor) and resistor R3 (e.g., a first current generator transistor). The first branch of the current generator is in parallel with the second branch of the current generator, where the gates of transistors P1 and P2 are connected together and the gates of transistors N3 and N4 are connected together.

The power supply circuitry 902 is configured to satisfy VDS2+Vth2<VG (for transistor N2). The VREF circuit 900 of FIG. 9 can be implemented with transistor N1 having a 600 mV–Vth, transistor N2 having a 200 mV–Vth, and transistor P3 having a 800 mV–Vth to provide input control current IB. Similar to FIG. 5, input control current IB is mirrored from a current generator including PMOS transistors P1, P2, NMOS transistors N3, N4 and resistor R3. The resistor R1/R2 (resistance) ratio can be set to 0.2. The resistor R1/R2 ratio can be 1 or less than 1 and can have a maximum value of 1.

The VREF circuit 900 of FIG. 9 provides compensation current Icomp based on the temperature, so that VREF is no longer temperature dependent. The power supply circuitry 902 can be implemented with any VREF circuitry described herein.

Figure 10:
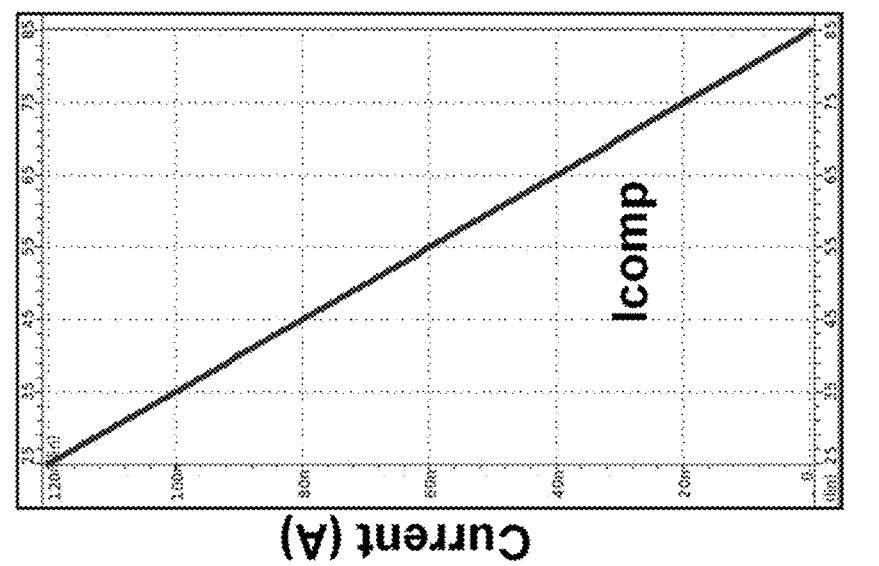
FIG. 10 is a graph that illustrates the value of compensation current Icomp discussed with reference to FIG. 4, wherein the graph depicts current versus temperature in C for compensation current Icomp.

FIG. 10 is a graph that illustrates the value of compensation current Icomp discussed above with reference to FIG. 4, wherein the graph depicts current versus temperature in C for compensation current Icomp. As illustrated, compensation current Icomp has a negative temperature coefficient TC that can be used to remove any variation of VREF based on changes in operating temperatures.

For example, at temperature 85 C, compensation current Icomp is 0 A and at temperature 25 C, compensation current Icomp provides current (e.g., 120 nA) at node VG to keep VREF at approximately 754 mv between 85 C and 25 C (see FIG. 12, discussed below in more detail with respect to VREF).

Responsive to compensation current Icomp providing an approximate current of 120 nA at node VG (e.g., when the temperature is approximately 25 C), the gate voltage of transistor N2 increases. Subsequently transistor N2 can operate in a deeper linear region enabling transistor N2 to conduct more current. As a result, both VDS2, and RDS2 (of transistor N2)=VDS2/IN2 begin to decrease and 1/(K2*RDS2) of equation (2a) is increased. Further, VG begins to increase at 25 C to boost VREF 17 mv at 25 C. Further, VG at 25 C is greater than at 85 C, since compensation current Icomp introduces a negative second term at equation (3a) for VREF at 25 C.

Figure 11B:
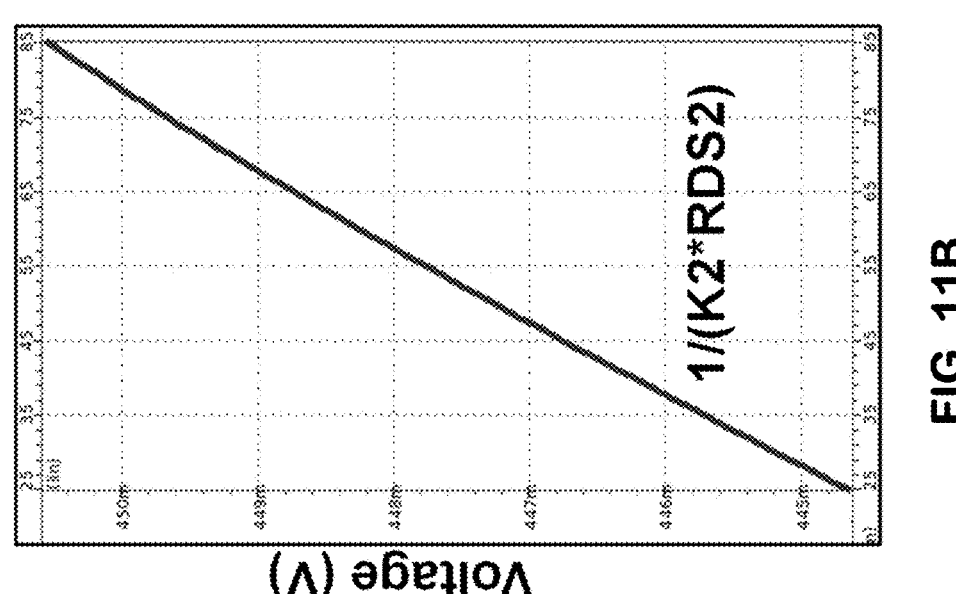
FIG. 11B is a graph that illustrates the 1/(K2*RDS2) component of FIG. 9, as discussed with reference to the equations associated with FIG. 3, wherein the graph depicts voltage versus temperature in C for 1/(K2*RDS2).
Figure 11A:
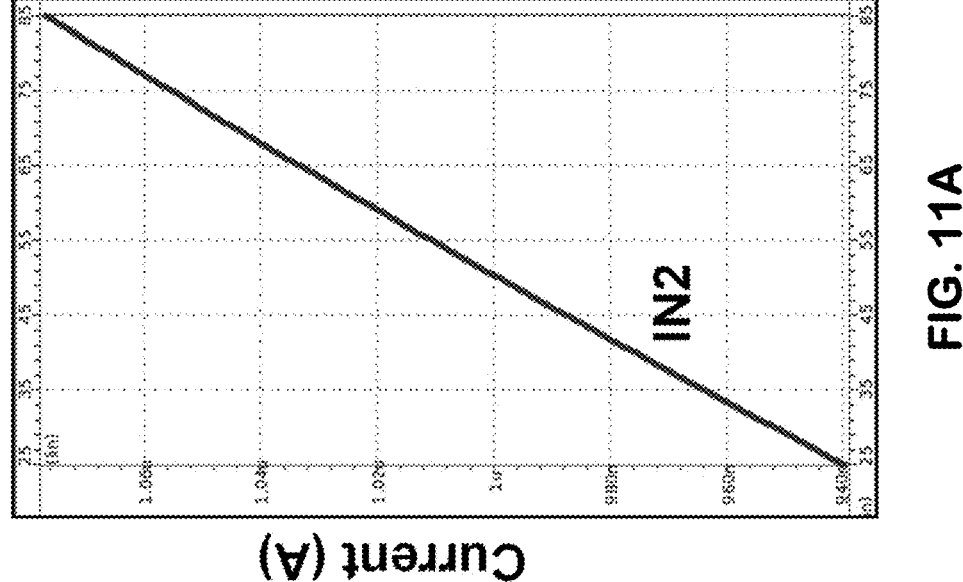
FIG. 11A is a graph that illustrates the IN2 component of FIG. 9, as discussed with reference to the equations associated with FIG. 3, wherein the graph depicts current versus temperature in C for IN2.

FIG. 11A is a graph that illustrates the IN2 component of FIG. 9, as discussed above with reference to the equations described above with reference to FIG. 3, wherein the graph of FIG. 11A depicts current versus temperature in C for IN2. As illustrated, the value of IN2 increases as temperature increases (e.g., has a positive temperature coefficient TC). Further, in comparison to the value of IN2 in FIG. 6A (regarding VREF circuits 300 and 500), the value of IN2 in FIG. 11A (regarding VREF circuit 900) at temperature 25 C is 110 nA higher (e.g., 850 nA vs 940 nA).

FIG. 11B is a graph that illustrates the 1/(K2*RDS2) component of FIG. 9, as discussed above with reference to the equations described above with reference to FIG. 3, wherein the graph depicts voltage versus temperature in C for 1/(K2*RDS2). As illustrated, the value of 1/(K2*RDS2) increases as the temperature increases (e.g., has a positive temperature coefficient TC). Further, in comparison to the value of 1/(K2*RDS2) in FIG. 6B (regarding VREF circuits 300 and 500), the value of 1/(K2*RDS2) in FIG. 11B (regarding VREF circuit 900), the value of 1/(K2*RDS2) at temperature 25 C is approximately 50.5 mV higher (e.g., 395 mV vs 445.5 mV).

Figure 12:
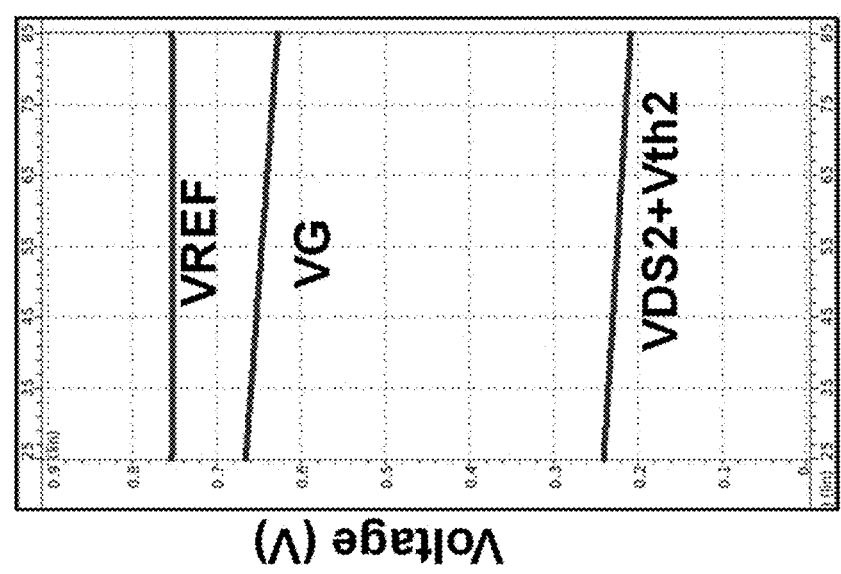
FIG. 12 is a graph that illustrates the voltages VG, VREF and VDS2+Vth2 for temperature ranges from 25 C to 85 C of FIG. 9.

FIG. 12 is a graph that illustrates voltage values for VG, VREF and VDS2+Vth2 for temperature ranges from 25 C to 85 C utilizing the VREF circuit 900 of FIG. 9.

As illustrated in FIG. 12, VREF is 754 mV at both 25 C and 85 C, with a zero-temperature coefficient TC. Further, the graph of FIG. 12 illustrates that VG decreases between 25 C and 85 C and VDS2+Vth2 decreases between 25 C and 85 C.

Additionally, as illustrated in FIG. 12, the reference voltage VREF exhibits a nominally-zero temperature coefficient TC that can result by matching two temperature coefficients TCs between the voltage at node VG and the compensation current Icomp (at a typical process corner (TT)). Circuit manufacturing can result in so-called process corner variations that can impact the operating characteristics of circuits and other components. The process corners include slow-slow (SS), slow-fast (SF), typical-typical (TT), fast-slow (FS) and fast-fast (FF). Therefore, due to manufacture skews, the voltage VERF at the process corners might deviate from the TT corner to others like FF, SS, FS and FS.

Figure 13:
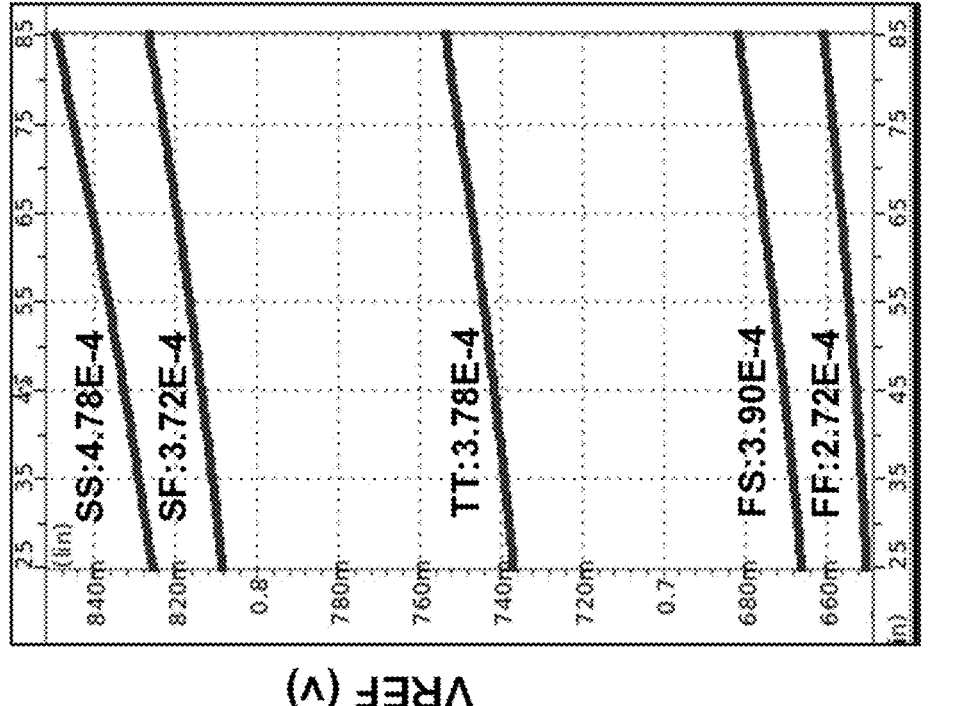
FIG. 13 is a graph that illustrates the variation of VREF in FIG. 5 with respect to temperature for each process corner without applying compensation current Icomp.

FIG. 13 is a graph that illustrates the variation of VREF in FIG. 5 with respect to temperature for each process corner without (before) applying compensation current Icomp. Specifically, the graph of FIG. 13 illustrates the difference for VREF for each of the process corners between temperatures 25 C and 85 C. A technique to compensate for the variation between process corners is to develop the compensation current Icomp that has tunable temperature coefficients TCs.

Figure 14:
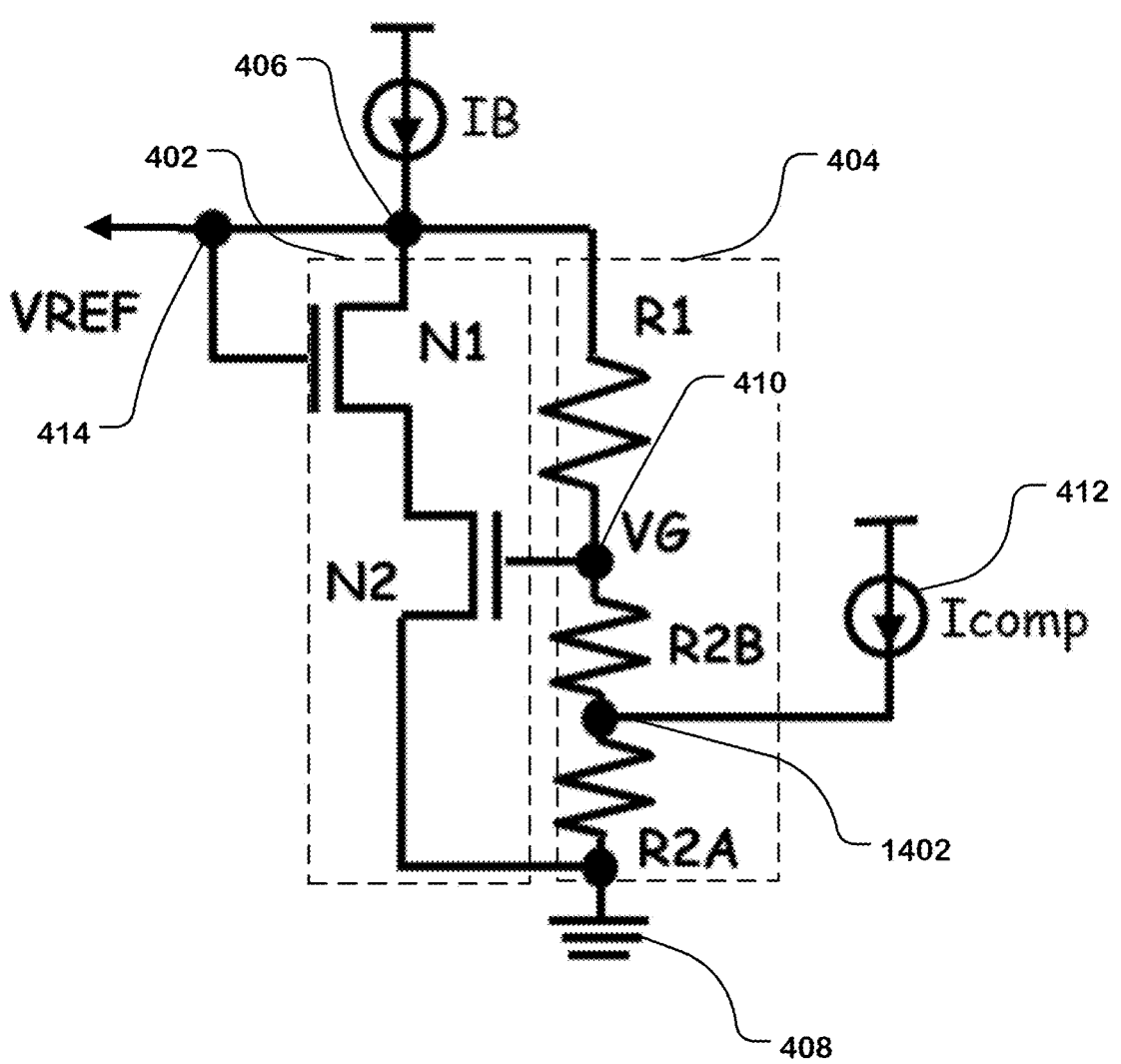
FIG. 14 illustrates a VREF circuit 1400, similar to that of the VREF circuit 400 of FIG. 4, except that resistor R2 is replaced by resistors R2A and R2B and VREF circuit 1400 has a different compensation current Icomp configuration.

FIG. 14 illustrates a VREF circuit 1400 (e.g., a voltage generation circuit), similar to that of the VREF circuit 400 of FIG. 4, except that resistor R2 is replaced by resistors R2A and R2B and VREF circuit 1400 has a different compensation current Icomp configuration. Descriptions of the components of the VREF circuit 1400 that are the same as the components of the VREF circuit 400 of FIG. 4 are omitted.

As mentioned, the second circuit 404 of the VREF circuit 1400 includes resistors R2B and R2A in place of resistor R2 of VREF circuit 400. Resistor R2B can be referred to as a second resistor and resistor R2A can be referred to as a third resistor, such that the second circuit 404 includes three resistors, with resistor R1 being the first resistor, resistor R2B being the second resistor and resistor R2A being the third resistor. Further, the VREF circuit 1400 implements another technique to compensate for temperature conditions by changing a connection node of the compensation current Icomp, as illustrated in FIG. 14.

For example, the VREF circuit 1400 is different from the VREF circuit 400, in that VREF circuit 1400 includes a node 1402 (e.g., a second node) located between resistor R2A and resistor R2B, wherein the node 1402 receives the compensation current Icomp 412. This is in contrast to the VREF circuit 400, wherein the node (VG) receives the compensation current Icomp 412.

Specifically, in VREF circuit 1400, resistor R2 of FIG. 4 can be replaced with resistor R2A and resistor R2B and the connection node of compensation current Icomp can be placed between resistor R2A and resistor R2B. The branch currents of resistors R2A and R2B can be expressed as IR2A (current resistor R2A)−compensation current Icomp=IR2B (current resistor R2B)=IR1 (current resistor R1).

Some of the operating characteristics of the VREF circuit 1400 of FIG. 14 are provided below. The derivations of VREF and ∂VREF/∂T are provided in equations (4a) and (4b) listed below. In addition, the second term in equation (4b) now has an additional factor of (R2A/R2), which depends on the connection node of compensation current Icomp. Because resistors R2A and R2B are tunable, after manufacture, the ratio of (R2A/R2) (e.g., resistance ratio) can be tuned to eliminate drifts of VREF's temperature coefficients TC at process corners. The resistance value of R2 is a combination of the resistance value of resistor R2A and resistor R2B. A ratio of (i) a resistance of the third resistor (R2A) to (ii) a combined resistance of the second resistor (R2B) and the third resistor (R2A) is tunable to account for manufacturing variations.

$$I_{R1} = I_{R2B} = I_{R2A} - I_{comp}$$

$$V_G = R_{2A} \cdot I_{R2A} + R_{2B} \cdot I_{R2B}$$

$$= R_{2A} \cdot (I_{R2B} + I_{comp}) + R_{2B} \cdot I_{R2B}$$

$$= I_{R2B} \cdot (R_{2A} + R_{2B}) + R_{2A} \cdot I_{comp}$$

$$= I_{R2B} \cdot R_2 + R_{2A} \cdot I_{comp}$$

$$I_{R2B} = (V_G - R_{2A} \cdot I_{comp})/R_2$$

$$V_{REF} = V_G + V_{R1} = V_G + R_1 \cdot I_{R1} \qquad (4a)$$

$$= V_G + R_1 \cdot I_{R2B}$$

$$= V_G + R_1 \cdot (V_G - R_{2A} \cdot I_{comp})/R_2$$

$$= (1 + R_1/R_2) \cdot V_G - (R_{2A}/R_2) \cdot R_1 \cdot I_{comp}$$

$$\partial V_{REF}/\partial T = \qquad (4b)$$

$$(1 + R_1/R_2) \cdot \partial V_G/\partial T - (R_{2A}/R_2) \cdot (\partial R_1/\partial T \cdot I_{comp} + R_1 \cdot \partial I_{comp}/\partial T)$$

Referring back to FIG. 10, the compensation current Icomp has approximately zero current at 85 C and has a negative temperature coefficient TC. The compensation current Icomp of FIG. 10 could be realized by implementing two biasing currents of similar (but opposite) values. For example, the compensation current Icomp can be derived by subtracting a biasing current having a positive temperature coefficient TC from a biasing current having a negative temperature coefficient TC. Circuitry to achieve this is discussed below with reference to FIG. 15. Compensation current Icomp can be generated using other techniques.

Figure 15:
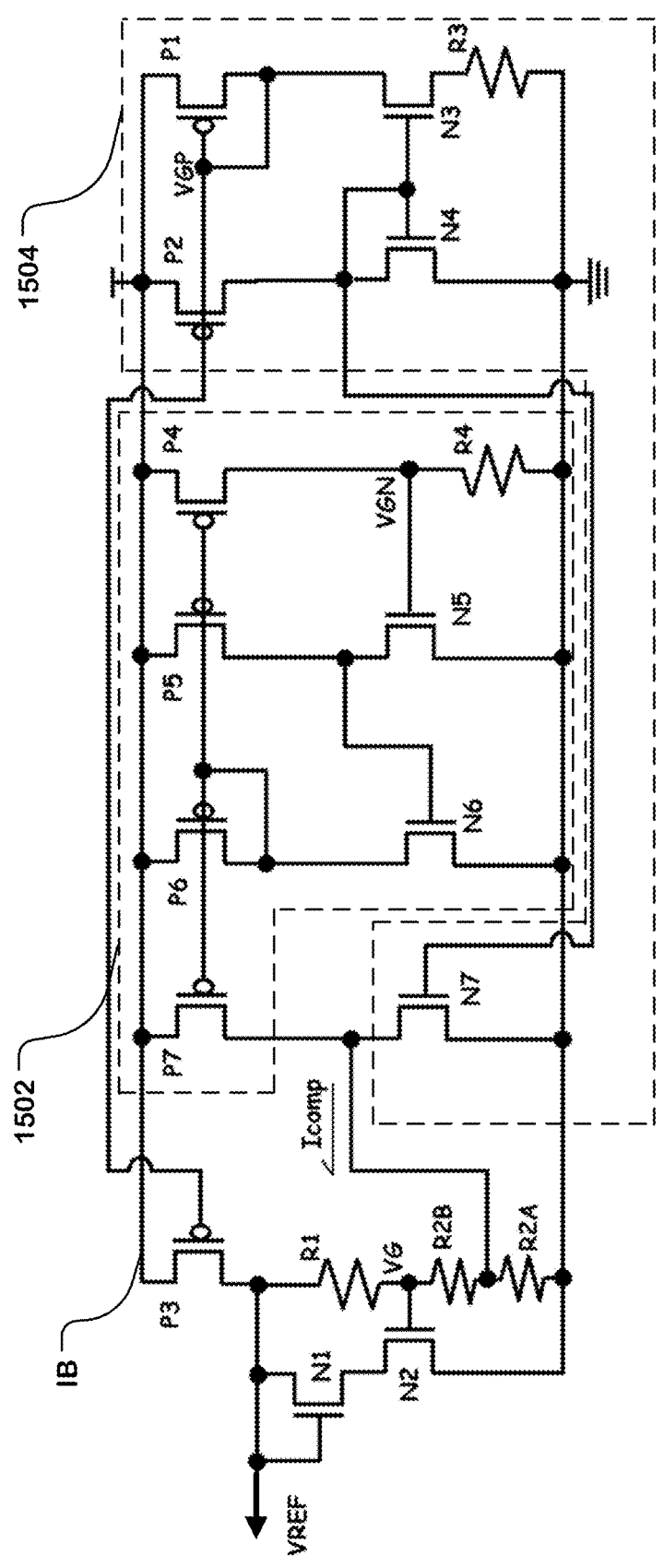
FIG. 15 illustrates a VREF circuit 1500 that includes the VREF circuit 1400 of FIG. 14, with additional circuitry that provides compensation current Icomp through various additional transistors and resistors.

FIG. 15 illustrates a VREF circuit 1500 (e.g., a voltage generation circuit) that includes the VREF circuit 1400 of FIG. 14, with additional circuitry that provides compensation current Icomp through various additional transistors and resistors. Similar to FIG. 9, transistors P1, P2, P3, N3, N4 and resistor R3 are illustrated in FIG. 15. Transistor P3 can be implemented to provide current IB. Further, current IB is mirrored from a current generator including PMOS transistors P1, P2, NMOS transistors N3, N4 and resistor R3.

The VREF circuit 1500 further includes negative biasing with current mirror circuitry 1502 and positive biasing with current mirror circuitry 1504. The negative biasing circuitry with current mirror 1502 provides a current having a negative temperature coefficient TC (from a lower operating temperature to a higher operating temperature, such as from 25° C. to 85 C). The positive biasing with current mirror circuitry 1504 provides a current having a positive temperature coefficient TC (from a lower operating temperature to a higher operating temperature, such as from 25 C to 85 C).

Specifically, a biasing portion of the negative biasing with current mirror circuitry 1502 includes PMOS transistors P4, P5, P6, NMOS transistors N5, N6 and resistor R4 that can realize a negative temperature coefficient TC biasing current. A mirror portion of the negative biasing with current mirror circuitry 1502 includes PMOS transistor P7. A biasing portion of the positive biasing with current mirror circuitry 1504 includes transistors P1, P2, N3, N4 and resistor R3 that can realize a positive temperature TC biasing current. A mirror portion of the positive biasing with current mirror circuitry 1504 includes NMOS transistor N7. The negative temperature coefficient TC biasing current provided by the biasing portion of the negative biasing with current mirror circuitry 1502 (e.g., transistors P4, P5, P6, N5, N6 and resistor R4) can be mirrored into the mirroring portion of the negative biasing with current mirror circuitry 1502 (e.g., PMOS transistor P7). Further, the positive temperature coefficient TC biasing current provided by the positive biasing with current mirror circuitry 1504 (e.g., transistors P1, P2, N3, N4 and resistor R3) can be mirrored into the mirroring portion of the positive biasing with current mirror circuitry 1504 (e.g., NMOS transistor N7). For compensation current Icomp to be approximately 0 A at temperature 85 C, a current IP7 thorough transistor P7 and a current IN7 through transistor N7 should be approximately equal at temperature 85 C.

The negative biasing circuitry 1502 and the positive biasing circuitry 1504 can be implemented with any VREF circuitry described herein.

Figure 16C:
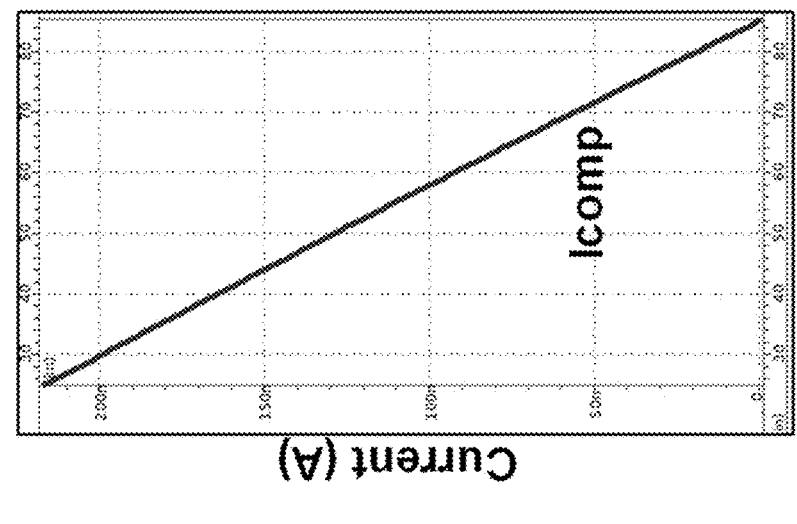
FIG. 16C is a graph that illustrates the value of the compensation current Icomp of the VREF circuit 1500 of FIG. 15, at process corner TT, resulting from current IP7 (see FIG. 16A) that has the negative temperature coefficient TC and current IN7 (see FIG. 16B) that has the positive temperature coefficient TC.
Figure 16B:
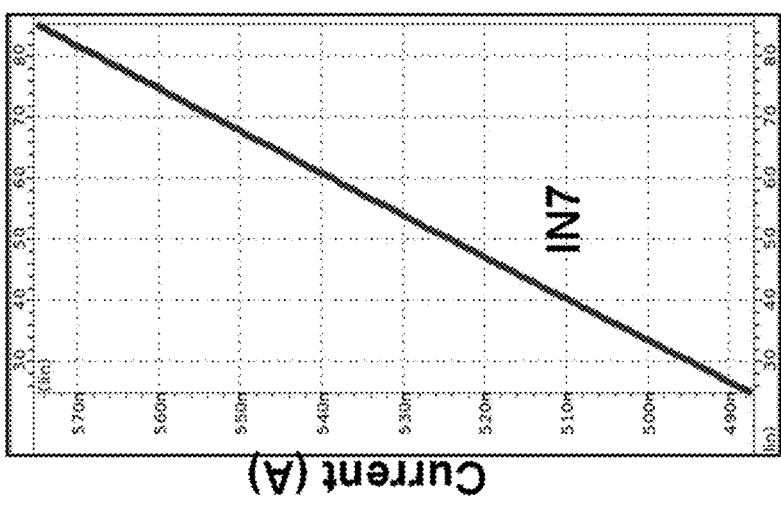
FIG. 16B is a graph that illustrates the current IN7 through transistor N7 of the VREF circuit 1500 of FIG. 15, wherein the current IN7 has a positive temperature coefficient TC.
Figure 16A:
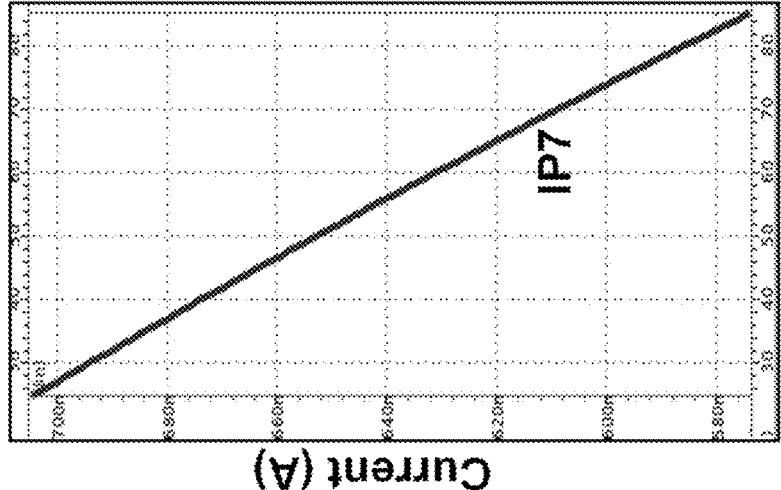
FIG. 16A is a graph that illustrates the current IP7 through transistor P7 of the VREF circuit 1500 of FIG. 15, wherein the current IP7 has a negative temperature coefficient TC.

FIG. 16A is a graph that illustrates the current IP7 through transistor P7 of the VREF circuit 1500 of FIG. 15, wherein the current IP7 has a negative temperature coefficient TC, such that at approximately 25 C the current IP7 has an approximate value of 703 nA and at approximately 85 C the current IP7 has an approximate value of 575 nA. FIG. 16A is for process corner TT.

FIG. 16B is a graph that illustrates the current IN7 through transistor N7 of the VREF circuit 1500 of FIG. 15, wherein the current IN7 has a positive temperature coefficient TC, such that at approximately 25 C the current IN7 has an approximate value of 487 nA and at approximately 85 C the current IN7 has an approximate value of 575 nA. FIG. 16B is for process corner TT.

To achieve similar values of current IP7 and current IN7 at 85 C, the mirrored ratios of transistors P7 and N7 can be adjusted accordingly (e.g., the sizes of transistors P7 and N7 can be selected accordingly to achieve the desired values of IP7 and IN7).

FIG. 16C is a graph that illustrates the value of the compensation current Icomp of the VREF circuit 1500 of FIG. 15, as discussed above, at process corner TT, resulting from the combined current IP7 (see FIG. 16A) that has the negative temperature coefficient TC and current IN7 (see FIG. 16B) that has the positive temperature coefficient TC. The value of compensation current Icomp equals current IP7 minus current IN7. The value of compensation current Icomp at 25 C is approximately 216 nA, which is approximately equal to the value of current IP7 (703 nA) minus the value of current IN7 (487 nA). Further, the value of compensation current Icomp at 85 C is approximately 0 A, which is approximately equal to the value of IP7 (575 nA) minus the value of current IN7 (575 nA).

In contrast to FIG. 10, where the value of compensation current Icomp at 25 C is approximately 120 nA, the value of compensation current Icomp in FIG. 16C is 216 nA, which is 96 nA larger than compensation current Icomp of FIG. 10. To achieve a desired value of compensation current Icomp (e.g., 120 nA) at 25 C, the VREF circuit of FIG. 15 can implement the methodology of the VREF circuit of FIG. 14 to adjust the ratio of resistor R2A to resistor R2B.

FIGS. 17A, 17B, 17C, 17D and 18 illustrate graphs using different R2A/R2 ratios for the VREF circuits 1400 and 1500 of FIGS. 14 and 15.

Figure 17B:
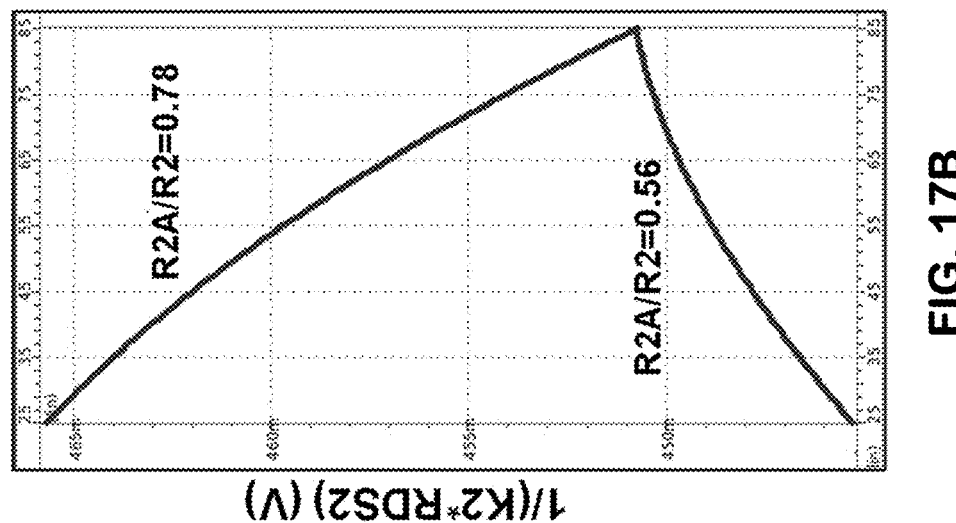
FIG. 17B is a graph that illustrates the voltage value of the 1/(K2*RDS2) component at varying temperature values and using different R2A/R2 ratios within the VREF circuits 1400 and 1500 of FIGS. 14 and 15.
Figure 17A:
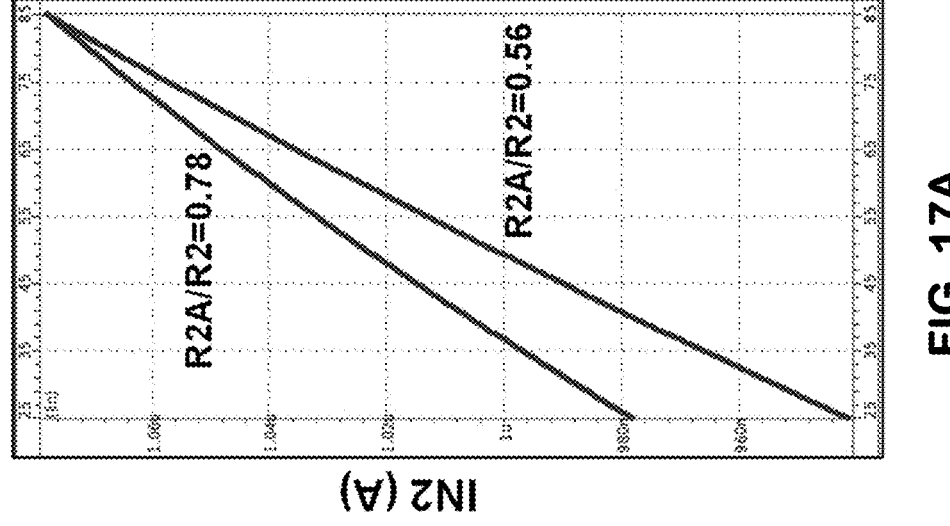
FIG. 17A is a graph that illustrates the value of current IN2 through transistor N2 using different R2A/R2 ratios within the VREF circuits 1400 and 1500 of FIGS. 14 and 15.

Specifically, FIG. 17A is a graph that illustrates the value of current IN2 through transistor N2 using different R2A/R2 ratios within the VREF circuits 1400 and 1500 of FIGS. 14 and 15. For example, using a R2A/R2 ratio of 0.78, current IN2 is approximately 978 nA at temperature 25 C and is approximately 1.067 uA at temperature 85 C. Using a R2A/R2 ratio of 0.56, current IN2 is approximately 941 nA at temperature 25 C and is approximately 1.067 uA at temperature 85 C. Decreasing the R2A/R2 ratio from 0.78 to 0.56 results in current IN2 being much smaller at temperature 25 C.

FIG. 17B is a graph that illustrates the voltage value of the 1/(K2*RDS2) component at varying temperature values and using different R2A/R2 ratios within the VREF circuits 1400 and 1500 of FIGS. 14 and 15. Using a R2A/R2 ratio of 0.78, the voltage of 1/(K2*RDS2) is approximately 466 mV at temperature 25 C and is approximately 451 mV at temperature 85 C. Using a R2A/R2 ratio of 0.56, the voltage of 1/(K2*RDS2) is approximately 445 mV at temperature 25 C and is approximately 451 mV at temperature 85 C. Decreasing the R2A/R2 ratio from 0.78 to 0.56 results in the voltage value of the 1 (K2*RDS2) component being much smaller at temperature 25 C.

Figure 17D:
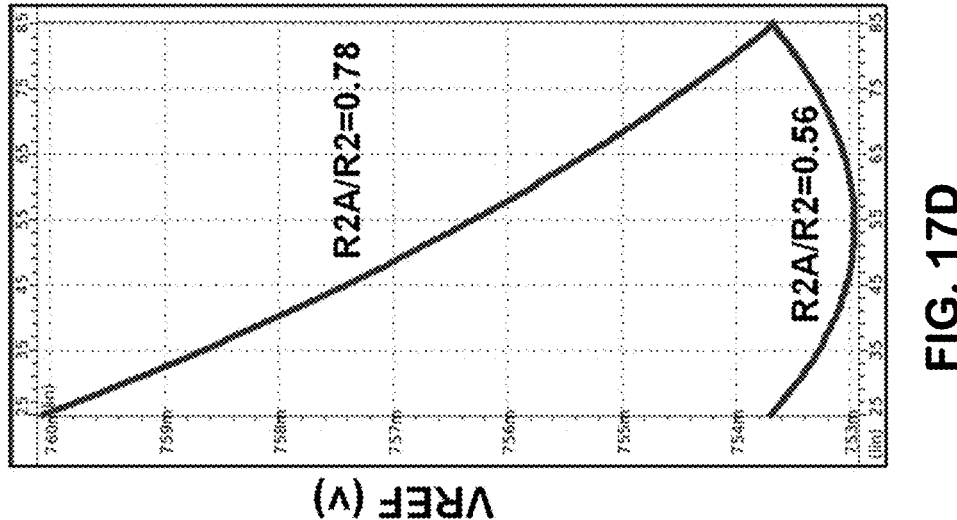
FIG. 17D is a graph that illustrates the voltage value of VREF at varying temperature values using different R2A/R2 ratios within the VREF circuits 1400 and 1500 of FIGS. 14 and 15.
Figure 17C:
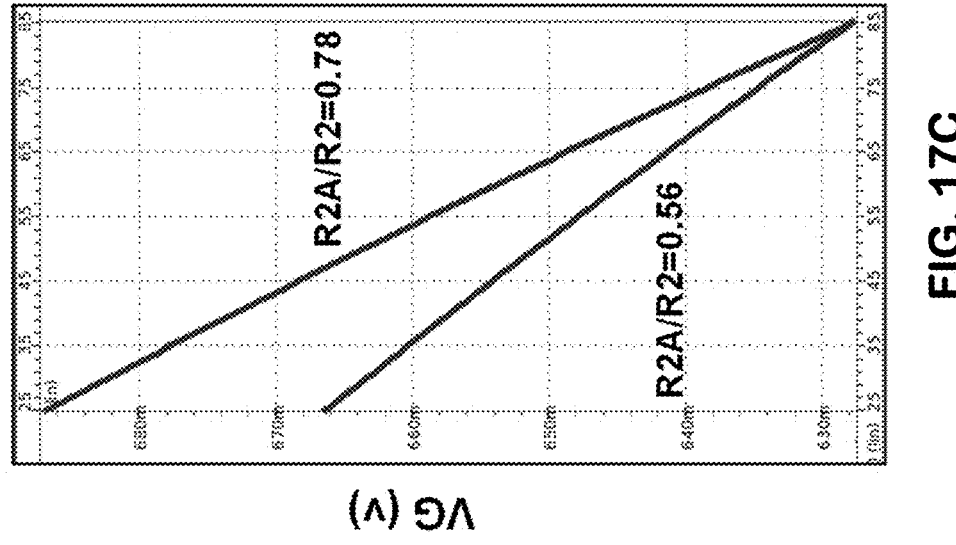
FIG. 17C is a graph that illustrates the voltage value of VG at varying temperature values using different R2A/R2 ratios within the VREF circuits 1400 and 1500 of FIGS. 14 and 15.

FIG. 17C is a graph that illustrates the voltage value of VG at varying temperature values using different R2A/R2 ratios within the VREF circuits 1400 and 1500 of FIGS. 14 and 15. Using a R2A/R2 ratio of 0.78, the voltage of VG is approximately 687 mV at temperature 25 C and is approximately 627 mV at temperature 85 C. Using a R2A/R2 ratio of 0.56, the volage of VG is approximately 666 mV at temperature 25 C and is approximately 627 mV at temperature 85 C. Decreasing the R2A/R2 ratio from 0.78 to 0.56 results in the voltage value of VG being much smaller at temperature 25 C.

FIG. 17D is a graph that illustrates the voltage value of VREF at varying temperature values using different R2A/R2 ratios within the VREF circuits 1400 and 1500 of FIGS. 14 and 15. Using a R2A/R2 ratio of 0.78, the voltage of VREF is approximately 760.2 mV at temperature 25 C and is approximately 753.7 mV at temperature 85 C. Using a R2A/R2 ratio of 0.56, the volage of VG is approximately 753.7 mV at temperature 25 C and is approximately 753.7 mV at temperature 85 C. Decreasing the R2A/R2 ratio from 0.78 to 0.56 results in the voltage value of VREF being slightly smaller at temperature 25 C and provides a zero-temperature coefficient TC for VREF, which is desirable.

Additionally, decreasing the R2A/R2 ratio from 0.78 to 0.56 results in the second term of equation 4a (i.e., (R2A/R2)*R1*Icomp) also becoming smaller. As a result, VREF, as illustrated in FIG. 17D, at 25 C gradually decreases from 760.2 mV (R2A/R2 ratio of 0.78) to 753.7 mV (R2A/R2 ratio of 0.56), where there is a temperature coefficient of 0 that is achieved at 85 C between the two ratio of R2A/R2.

Figure 18:
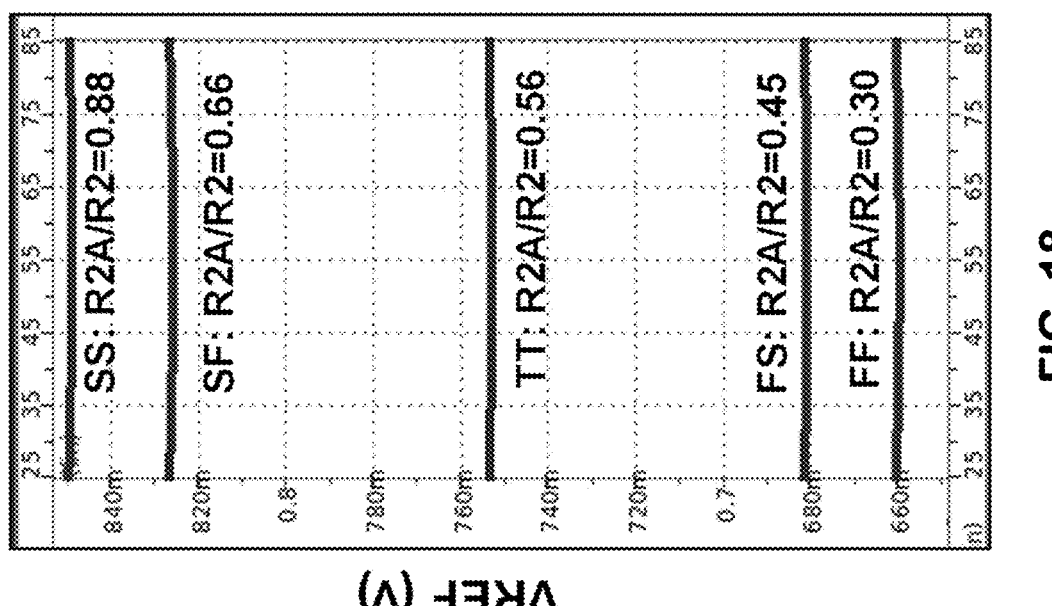
FIG. 18 is a graph that illustrates VREF for varying process corners FF, FS, TT, SF and SS between temperatures 25 C and 85 C using different R2A/R2 ratios within the VREF circuits 1400 and 1500 of FIGS. 14 and 15.

FIG. 18 is a graph that illustrates VREF for varying process corners FF, FS, TT, SF and SS between temperatures 25 C and 85 C using different R2A/R2 ratios within the VREF circuits 1400 and 1500 of FIGS. 14 and 15. As illustrated, VREF is very consistent over varying temperature ranges.

Figure 19:
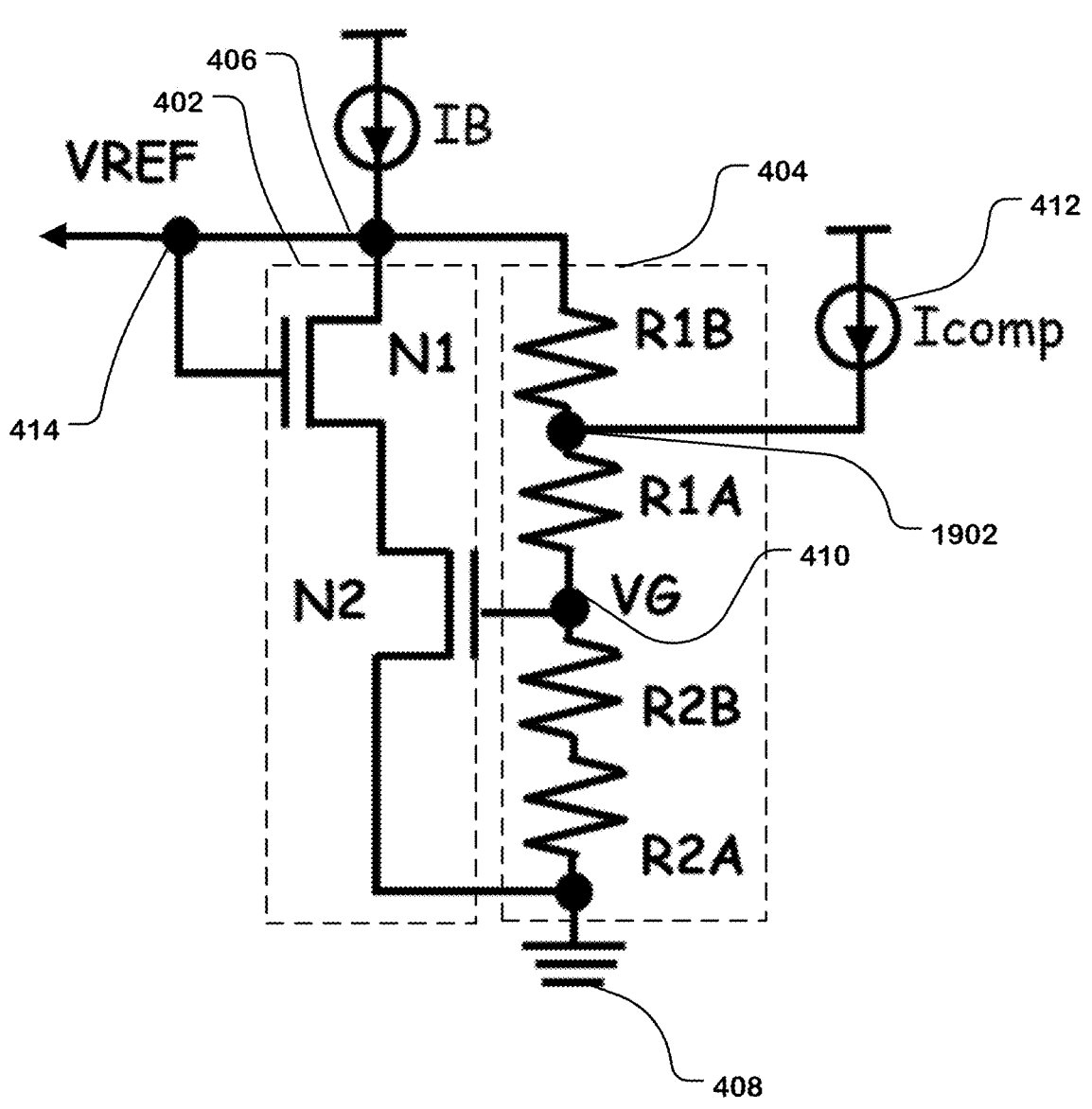
FIG. 19 illustrates a VREF circuit 1900 that is similar to the VREF circuit 1400 of FIG. 14, except that resistor R1 is replaced by resistors R1A and R1B in a similar manner that resistor R2 was replaced by resistors R2A and R2B in FIG. 14 and VREF circuit 1900 has a different compensation current Icomp configuration.

FIG. 19 illustrates a VREF circuit 1900 (e.g., a voltage generation circuit) that is similar to the VREF circuit 1400 of FIG. 14, except that resistor R1 is replaced by resistors R1A and R1B in a similar manner that resistor R2 was replace by resistors R2A and R2B in FIG. 14, wherein VREF circuit 1900 has a different compensation current Icomp configuration. Descriptions of the components of the VREF circuit 1900 that are the same as the components of the VREF circuit 1400 of FIG. 14 are omitted.

As mentioned, the second circuit 404 of the VREF circuit 1900 includes resistors R1B and R1A in place of resistor R1 of VREF circuit 1400. Resistor R1B can be referred to as a first resistor, resistor R1A can be referred to as a second resistor, resistor R2A can be referred to as a fourth resistor and resistor R2B can be referred to as a third resistor. Further, the VREF circuit 1900 implements another technique to compensate for temperature conditions by changing a connection node of the compensation current Icomp, as illustrated in FIG. 19.

For example, the VREF circuit 1900 is different from the VREF circuit 1400, in that VREF circuit 1900 includes a node (e.g., a second node) 1902 located between resistor R1A and resistor R1B, wherein the node 1902 receives the compensation current Icomp 412. This is in contrast to the VREF circuit 1400, where the node that receives the compensation current Icomp is located between resistor R2A and resistor R2B.

Some of the operating characteristics of the VREF circuit of FIG. 19 are provided below.

The derivations of VREF and ∂VREF/∂T are provided in equations (5a) and (5b) listed below. In equations (5a) and (5b), the term (R1B/R1) replaces the term (R2A/R2) of $$V_G = (R_{2A} + R_{2B}) \cdot I_{R2} = R_2 \cdot I_{R2} \text{ and } I_{R2} = I_{R1A}$$

$$I_{R1B} = I_{R1A} - I_{comp} = I_{R2} - I_{comp}$$

$$V_{REF} = V_G + V_{R1} = V_G + R_{1A} \cdot I_{R1A} + R_{1B} \cdot I_{R1B} \quad (5a)$$

$$= V_G + R_{1A} \cdot I_{R2} + R_{1B} \cdot (I_{R2} - I_{comp})$$

$$= V_G + I_{R2} \cdot (R_{1A} + R_{1B}) - R_{1B} \cdot I_{comp}$$

$$= (1 + R_1/R_2) \cdot V_G - (R_{1B}/R_1) \cdot R_1 \cdot I_{comp}$$

$$\partial V_{REF}/\partial T = \quad (5b)$$

$$(1 + R_1/R_2) \cdot \partial V_G/\partial T - (R_{1B}/R_1) \cdot (\partial R_1/\partial T \cdot I_{comp} + R_1 \cdot \partial I_{comp}/\partial T)$$

equations (4a) and (4b). The term R1 represents the combined resistance of resistors R1A and R1B.

A first ratio of (i) a resistance of the first resistor (resistor R1B) to (ii) a combined resistance (R1) of the first resistor (R1B) and the second resistor (R1A) is tunable to account for manufacturing variations. Further, a second ratio of (i) a resistance of the fourth resistor (R2A) to (ii) a combined resistance (R2) of the third resistor (R2B) and the fourth resistor (R2A) is tunable to account for manufacturing variations. In an embodiment, the second ratio is less than or equal to 1 and the first ratio is less than the second ratio. Alternatively, the first ratio can be greater than the second ratio. Further, the first ration and the second ration can have a maximum value of 1.

Figure 20:
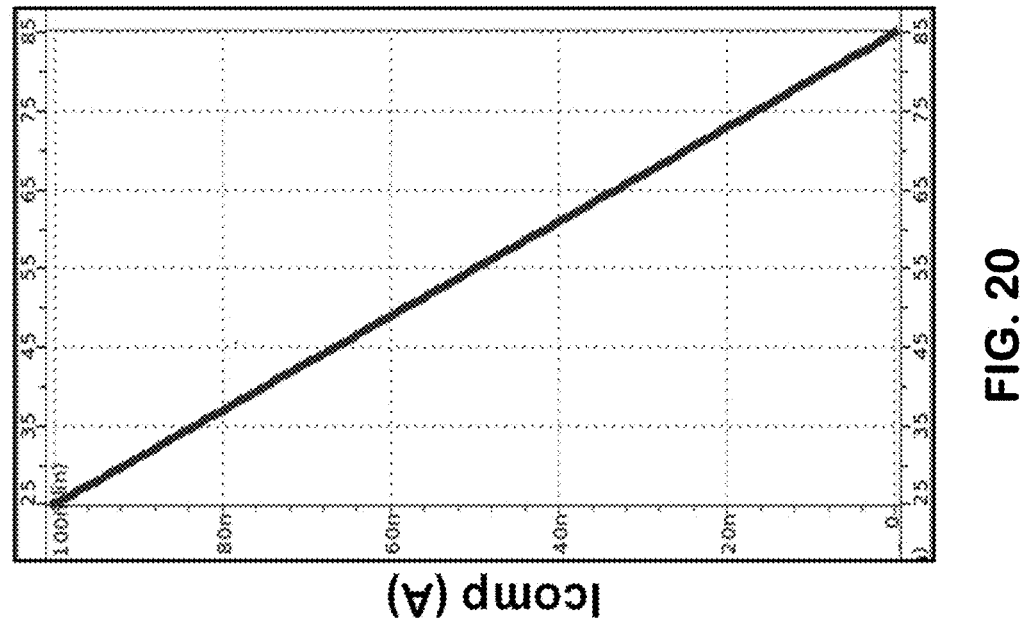
FIG. 20 is graph that illustrates the compensation current Icomp of the VREF circuit 1900 of FIG. 19.

FIG. 20 is graph that illustrates the compensation current Icomp of the VREF circuit 1900 of FIG. 19. As illustrated, compensation current Icomp has an approximate value of 100 nA at temperature 25 C and an approximate value of 0 A at temperature 85 C.

Figures 21A, 21B, 21C:
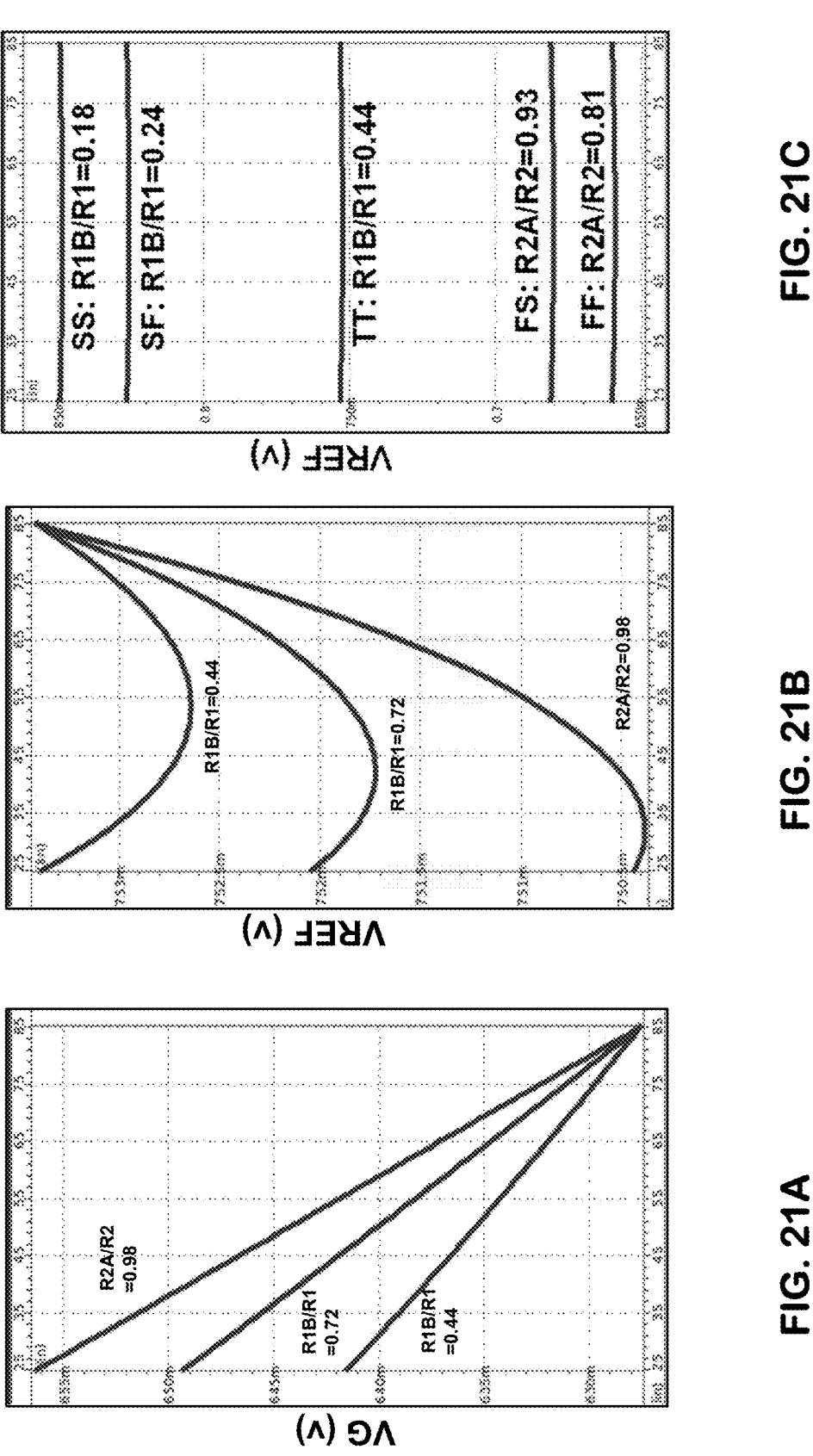
FIG. 21A is a graph that illustrates the voltage value of VG at varying R1B/R1 ratios and a R2A/R2 ratio over a temperature range from 25 C to 85 C of the VREF circuit 1900 of FIG. 19.
FIG. 21B is a graph that illustrates the voltage value of VREF at varying R1B/R1 and R2A/R2 ratios over a temperature range from 25 C to 85 C of the VREF circuit 1900 of FIG. 19.
FIG. 21C is a graph that illustrates VREF for varying process corners FF, FS, TT, SF and SS between temperatures 25 C and 85 C using different R1B/R1 and R2A/R2 ratios of the VREF circuit 1900 of FIG. 19.

FIG. 21A is a graph that illustrates the voltage value of VG at varying R1B/R1 ratios and a R2A/R2 ratio over a temperature range from 25 C to 85 C of the VREF circuit 1900 of FIG. 19. For the R2A/R2 ratio of 0.98, which is near the maximum value of 1, the voltage value of VG is 656 mV at temperature 25 C and is 627.5 mV at temperature 85 C. Using R1B/R1 ratio values of 0.72 and 0.44, the voltage value of VG, at temperature 25 C, is approximately 649 mV and 641.5 mV respectively. When the R1B/R1 ratio value is 0.72 or 0.44, the R2A/R2 ratio value can be 1 or less than 1 and can have a maximum value of 1. At temperature 85 C, the voltage value of VG is approximately 627.5 mV for each of R1B/R1 ratio values of 0.72 and 0.44. Further, when the R2A/R2 ratio is 0.98, the R1B/R1 ratio can be 1 or less than 1 and can have a maximum value of 1.

FIG. 21B is a graph that illustrates the voltage value of VREF at varying R1B/R1 and R2A/R2 ratios over a temperature range from 25 C to 85 C of the VREF circuit 1900 of FIG. 19. For a R2A/R2 ratio value of 0.98, which is near the maximum value of 1, a zero-temperature coefficient TC VREF could not be achieved. For R1B/R1 ratio values of 0.72 and 0.44, the voltage value of VREF, at temperature 25 C, is approximately 752 mV and 753.5 mV respectively. At temperature 85 C, the voltage value of VREF is approximately 753.5 mV for each of R1B/R1 and R2A/R2 ratio values of 0.98, 0.72 and 0.44. As illustrated, by connecting the second node of compensation current Icomp in between resistors R1A and R1B and gradually decreasing the R1B/R1 ratio from 0.72 to 0.44, VREF at temperature 25 C approximately equals VREF at temperature 85 C (e.g., 753.5 mV).

FIG. 21C is a graph that illustrates VREF for varying process corners FF, FS, TT, SF and SS between temperatures 25 C and 85 C using different R1B/R1 and R2A/R2 ratios of the VREF circuit 1900 of FIG. 19.

Figure 22:
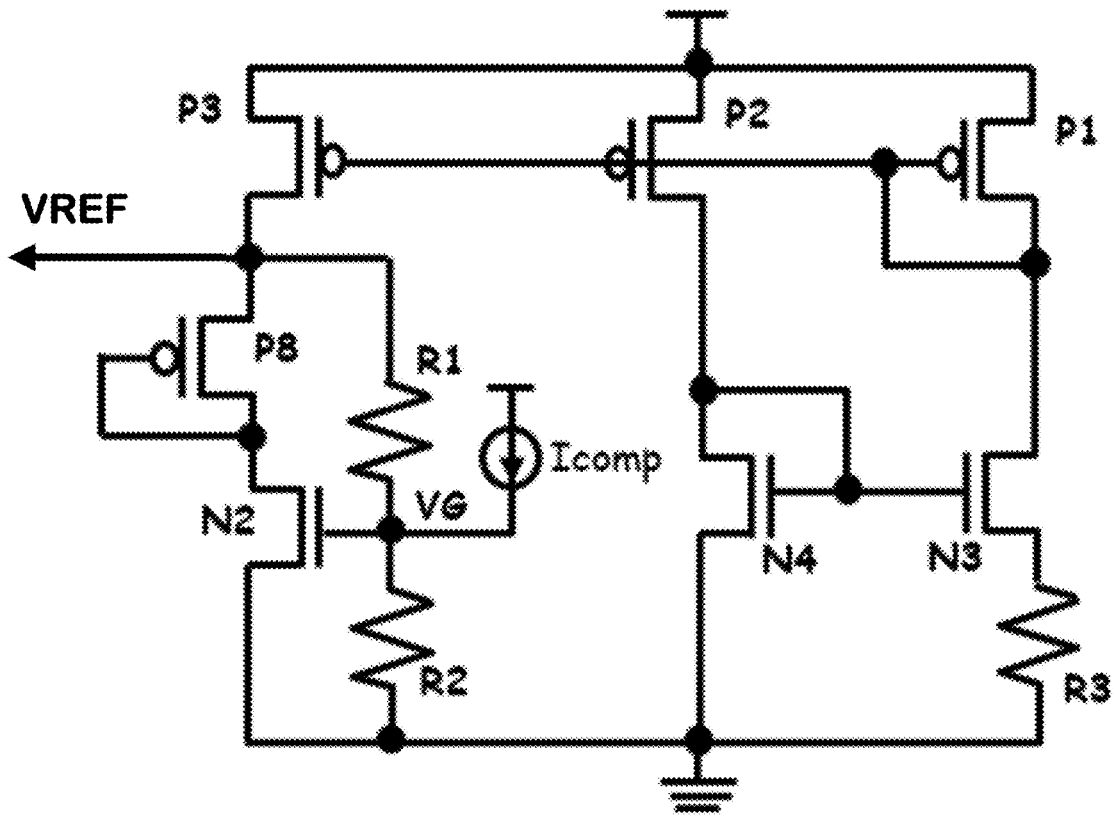
FIG. 22 illustrates a VREF circuit 2200 that is similar to the VREF circuit 900 of FIG. 9, except that NMOS transistor N1 of FIG. 9 has been relace by PMOS transistor P8.

FIG. 22 illustrates a VREF circuit 2200 (e.g., a voltage generation circuit) that is similar to the VREF circuit 900 of FIG. 9, except that NMOS transistor N1 of FIG. 9 has been relace by PMOS transistor P8.

The VREF circuit 900 of FIG. 9 fulfills ∂VREF/∂T=0 (or equation (3b)=0), from temperatures 25 C to 85 C, which employs a relatively small ∂R1/∂T, where the graph of FIG. 10 illustrates a negative temperature coefficient for compensation current Icomp and the graph of FIG. 12 illustrates a negative temperature coefficient for voltage VG.

For other embodiments, ∂VREF/∂T=0 can be achieved without having negative temperature coefficients for compensation current Icomp and voltage VG. For example, the 600 mV–Vth NMOS transistor N1, as illustrated in FIG. 9, can be replaced with a 700 mV–Vth PMOS transistor P8, as illustrated in FIG. 22. Using this VREF circuit 2200 of FIG. 22 with the transistor P8, a positive temperature coefficient TC for compensation current Icomp can be achieved.

Figure 23:
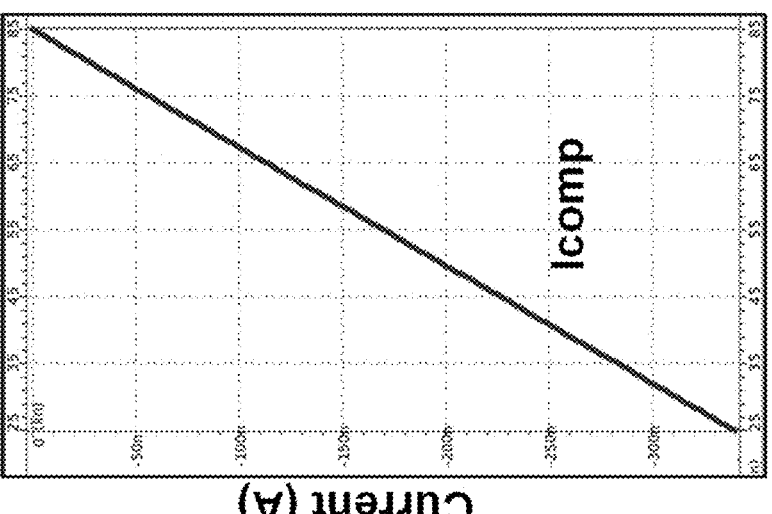
FIG. 23 is a graph that illustrates compensation current Icomp, for VREF circuit 2200 of FIG. 22, that has a positive temperature coefficient TC.

FIG. 23 is a graph that illustrates compensation current Icomp, for VREF circuit 2200 of FIG. 22, that has a positive temperature coefficient TC, such that at temperature 25 C compensation current Icomp is approximately −340 nA and at temperature 85 C compensation current Icomp is approximately 0V.

Figure 24:
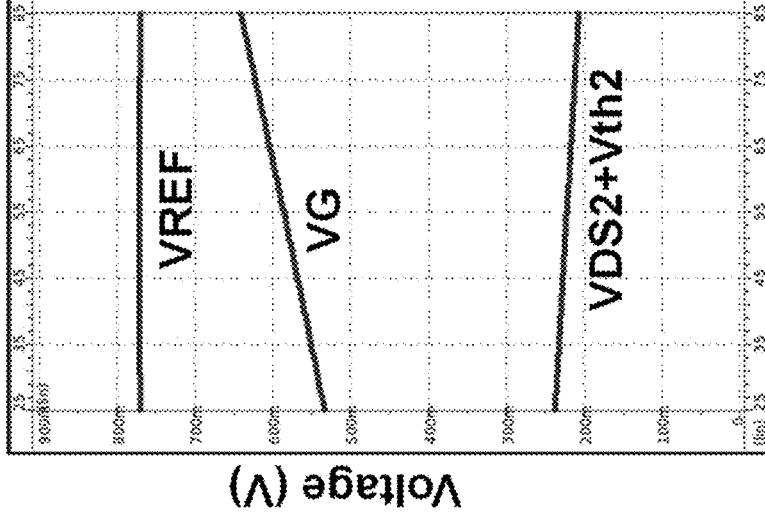
FIG. 24 is a graph that illustrates the values of voltages VREF, VG and VDS2+Vth2 of transistor N2 when the compensation current Icomp of FIG. 23 is applied to the VREF circuit 2200 of FIG. 22.

FIG. 24 is a graph that illustrates the values of voltages VREF, VG and VDS2+Vth2 of transistor N2 when the compensation current Icomp of FIG. 23 is applied to the VREF circuit 2200 of FIG. 22. As illustrated in FIG. 24, from temperatures 25 C to 85 C, voltage VG has a positive temperature coefficient TC, voltage VREF has a zero-temperature coefficient and VDS2+Vth2 has a negative temperature coefficient TC.

Figure 25:
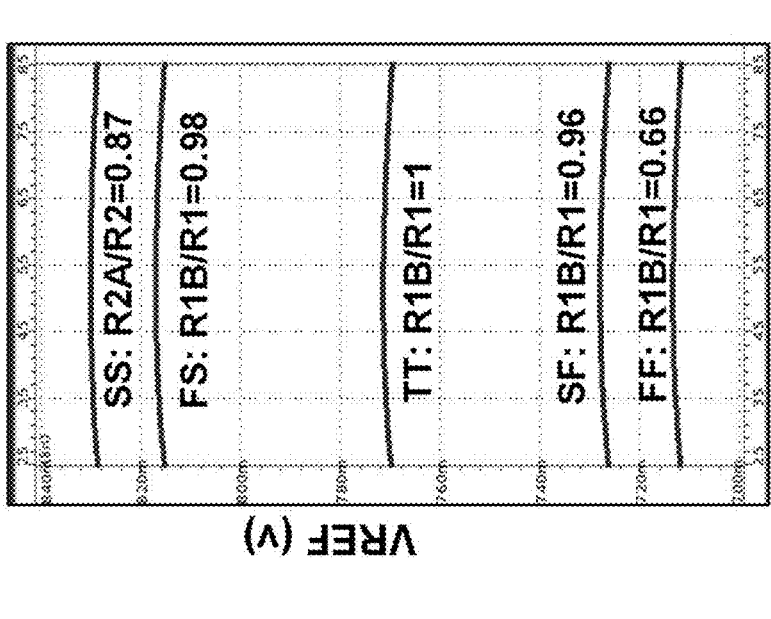
FIG. 25 is a graph that illustrates VREF for varying process corners FF, SF, TT, FS and SS with varying R1B/R1 ratios of 0.66, 0.96, 1.0 and 0.98 and a R2A/R2 (resistance) ratio of 0.87 for the VREF circuit 2200 of FIG. 22.

FIG. 25 is a graph that illustrates the VREF for varying process corners FF, SF, TT, FS and SS with varying R1B/R1 ratios of 0.66, 0.96, 1.0 and 0.98 and a R2A/R2 ratio of 0.87 for the VREF circuit 2200 of FIG. 22. VREF of FIG. 24 is illustrated as the TT of FIG. 25, where R1B/R1=1, and the corresponding equation (3b) from above is approximately zero. Varying process corners can also deviate Icomp and VG, wherein equation (3b) approximately equaling zero may not hold. Changing the ratio of R1B/R1 and/or R2A/R2 can set equations (4b) and/or (5b) from above to approximately zero. The resulting temperature coefficient TC of VREFs have minimal not no drift under varying process corners.

A VGS voltage of an NMOS transistor in a linear region can be used to generate reference voltage VREF. A connection node (e.g., between resistors R2B and R2A of FIGS. 14 and 15) of compensation current Icomp can be used to eliminate drifts of the temperature coefficient TC of VREF. The temperature coefficient TC of VREF can be modified by VREF measurements after manufacture, as described with respect to FIGS. 14 and 15.

The embodiments described herein can be applied to a VREF circuit that has temperature variations that are dominated by fluctuations of MOS threshold voltage and carrier mobility.

Figure 26:
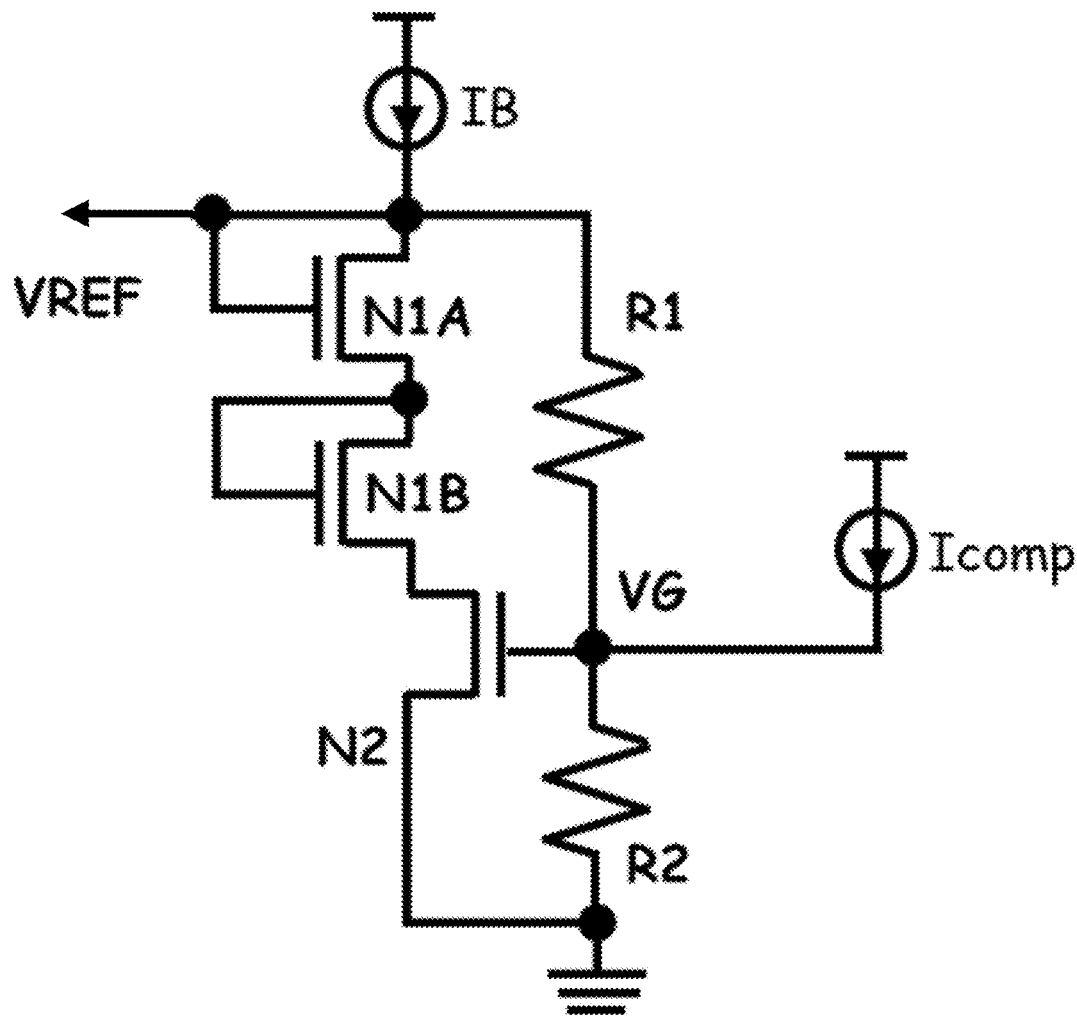
FIG. 26 illustrates a VREF circuit 2600 that only uses NMOS-type transistors, wherein VREF circuit 2600 is similar to VREF circuit 400 of FIG. 4, except that transistor N1 is replaced by transistors N1A and N1B.

FIG. 26 illustrates a VREF circuit 2600 (e.g., a voltage generation circuit) that only uses NMOS-type transistors, wherein VREF circuit 2600 is similar to VREF circuit 400 of FIG. 4, except that transistor N1 is replaced by transistors N1A and N1B.

Further, the VREF circuit 400 of FIG. 4 includes resistors R1, R2, and NMOS transistors N1, N2. According to the KVL rule, VREF=VG(1+R1/R2). Assume that transistor N1 of FIG. 4 operates in a saturation region and transistor N2 operates in a linear region. To satisfy VDS2+Vth2<VG, the embodiment in FIG. 9 employs a 600 mV–Vth NMOS transistor N1 and a 200 mV–Vth NMOS transistor N2, where transistor N1 could also be replaced with multiple stacking NMOS transistors of 200 mV–Vth. For example, transistor N1 of the VREF circuit 400 of FIG. 4 can be replaced with two stacking NMOS transistors N1A and N1B, as illustrated in FIG. 26. Transistors NIA, N1B, N2 can all be 200 mV–Vth NMOS transistors.

The technology disclosed is not limited to compensating for temperatures between 25 C and 85 C. For example, the VREF circuits described herein can compensate for temperature ranges between –10 C to 110 C or even larger temperature ranges. The embodiments described herein can be implemented in memory devices, micro-controllers, a system on a chip (SoC), as well as other components that would be apparent to a person of ordinary skill in the art to require accurate and consistent VREF voltages over varying temperature ranges.

Other implementations of the method described in this section can include a non-transitory computer readable storage medium storing instructions executable by a processor to perform any of the methods described above. Yet another implementation of the method described in this section can include a system including memory and one or more processors operable to execute instructions, stored in the memory, to perform any of the methods described above.

Any data structures and code described or referenced above are stored according to many implementations on a computer-readable storage medium, which may be any device or medium that can store code and/or data for use by a computer system. This includes, but is not limited to, volatile memory, non-volatile memory, application-specific integrated circuits (ASICs), field-programmable gate arrays (FPGAs), magnetic and optical storage devices such as disk drives, magnetic tape, CDs (compact discs), DVDs (digital versatile discs or digital video discs), or other media capable of storing computer-readable media now known or later developed.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A voltage generation circuit that receives an input control current and outputs a reference voltage (VREF), the voltage generation circuit comprising:
   a first circuit including a first transistor and a second transistor connected in series between a first node receiving the input control current and a supply node;
   a second circuit including a first resistor and a second resistor connected in series between the first node and the supply node,
      wherein the input control current is divided between the first circuit and the second circuit;
   a reference node that outputs the reference voltage (VREF) and that is connected to the first transistor of the first circuit;
   a second node located between the first resistor and the second resistor and in electrical communication with the second transistor; and
   a current supply circuit connected to the second node and providing a compensation current that influences the reference voltage (VREF) to account for changes in operating temperatures of the voltage generation circuit.

2. The voltage generation circuit of claim 1, wherein first resistor and the second resistor are both tunable.

3. The voltage generation circuit of claim 1, wherein the second node is connected to a gate of the second transistor.

4. The voltage generation circuit of claim 1, wherein the first transistor and the second transistor are NMOS transistors.

5. The voltage generation circuit of claim 1, wherein the reference voltage (VREF) is not influenced by operating temperature variations as a result of the compensation current having a decreasing slope from a lower operating temperature to a higher operating temperature, resulting from a negative operating temperature coefficient.

6. The voltage generation circuit of claim 5, wherein the operating temperatures range from 25 C to 85 C.

7. The voltage generation circuit of claim 1, wherein the input control current is received from a power supply circuit at the first node and wherein the power supply circuit includes:
   a first power supply transistor that is in series with the first transistor and the second transistor, that receives a power supply and that provides the input control current to the first node; and
   a current generator that controls a current that is mirrored to the first power supply node.

8. The voltage generation circuit of claim 7, wherein the current generator includes:
   a first branch (i) including a first current generator transistor in series with a second current generator transistor and (ii) located between a power supply and the supply node; and
   a second branch (i) including a third current generator transistor in series with a fourth current generator transistor and a first current generator resistor and (ii) located between the power supply and the supply node, wherein the first branch is parallel to the second branch.

9. The voltage generation circuit of claim 8, wherein the first current generator transistor and the third current generator transistor are PMOS transistors and the second current generator transistor and the fourth current generator transistor are NMOS transistors.

10. The voltage generation circuit of claim 1, wherein a ratio of a resistance of the first resistor to a resistance of the second resistor is less than 1.

11. The voltage generation circuit of claim 10, wherein the ratio is approximately 0.2.

12. A voltage generation circuit that receives an input control current and outputs a reference voltage (VREF), the voltage generation circuit comprising:

a first circuit including a first transistor and a second transistor connected in series between a first node receiving the input control current and a supply node;

a second circuit including a first resistor, a second resistor and a third resistor connected in series between the first node and the supply node, wherein the input control current is divided between the first circuit and the second circuit;

a reference node that outputs the reference voltage (VREF) and that is connected to the first transistor of the first circuit;

a second node located between the second resistor and the third resistor and in electrical communication with the second transistor; and a current supply circuit connected to the second node and providing a compensation current that influences the reference voltage (VREF) to account for changes in operating temperatures of the voltage generation circuit.

13. The voltage generation circuit of claim 12, wherein a ratio of (i) a resistance of the third resistor to (ii) a combined resistance of the second resistor and the third resistor is tunable to account for manufacturing variations.

14. The voltage generation circuit of claim 13, wherein the ratio has a maximum value of 1.

15. The voltage generation circuit of claim 12, wherein the current supply circuit includes:

positive biasing current circuitry that provides a current having a positive temperature coefficient from a lower operating temperature to a higher operating temperature; and negative biasing current circuitry that provides a current having a negative temperature coefficient from the lower operating temperature to the higher operating temperature, wherein the compensation current is a combination of the current having the positive temperature coefficient and the negative temperature coefficient.

16. The voltage generation circuit of claim 15, wherein the combination of the current having the positive temperature coefficient and the current having the negative temperature coefficient, at the higher operating temperature, results in the compensation current having an approximate value of 0 A.

17. The voltage generation circuit of claim 12, wherein the first transistor and the second transistor are NMOS transistors.

18. A voltage generation circuit that receives an input control current and outputs a reference voltage (VREF), the voltage generation circuit comprising:

a first circuit including a first transistor and a second transistor connected in series between a first node receiving the input control current and a supply node;

a second circuit including a first resistor, a second resistor, a third resistor and a fourth resistor connected in series between the first node and the supply node, wherein the input control current is divided between the first circuit and the second circuit;

a reference node that outputs the reference voltage (VREF) and that is connected to the first transistor of the first circuit;

a second node located between the first resistor and the second resistor and in electrical communication with the second transistor; and a current supply circuit connected to the second node and providing a compensation current that influences the reference voltage (VREF) to account for changes in operating temperatures of the voltage generation circuit.

19. The voltage generation circuit of claim 18, wherein:

a first ratio of (i) a resistance of the first resistor to (ii) a combined resistance of the first resistor and the second resistor is tunable to account for manufacturing variations; and a second ratio of (i) a resistance of the fourth resistor to (ii) a combined resistance of the third resistor and the fourth resistor is tunable to account for manufacturing variations.

20. The voltage generation circuit of claim 19, wherein the first ration and the second ratio have a maximum value of 1.

* * * * *